United States Patent
Hantschel et al.

(10) Patent No.: US 6,734,425 B2
(45) Date of Patent: *May 11, 2004

(54) SCANNING PROBE SYSTEM WITH SPRING PROBE AND ACTUATION/SENSING STRUCTURE

(75) Inventors: Thomas Hantschel, Menlo Park, CA (US); Eugene M. Chow, Stanford, CA (US); David K. Fork, Los Altos, CA (US); Michel A. Rosa, Santa Clara, CA (US); Dirk De Bruyker, Palo Alto, CA (US)

(73) Assignee: Xerox Corporation, Stamford, CT (US)

( * ) Notice: Subject to any disclaimer, the term of this patent is extended or adjusted under 35 U.S.C. 154(b) by 113 days.

This patent is subject to a terminal disclaimer.

(21) Appl. No.: 10/136,258

(22) Filed: Apr. 30, 2002

(65) Prior Publication Data

US 2003/0183761 A1 Oct. 2, 2003

Related U.S. Application Data

(63) Continuation-in-part of application No. 10/112,215, filed on Mar. 29, 2002, now Pat. No. 6,668,628.

(51) Int. Cl.[7] .............................. G01B 5/28; G01B 7/34
(52) U.S. Cl. .......................... 250/306; 250/307; 73/105
(58) Field of Search ................................. 250/306, 307; 73/105

(56) References Cited

U.S. PATENT DOCUMENTS

| | | | |
|---|---|---|---|
| 3,842,189 A | 10/1974 | Southgate | |
| 5,399,232 A | 3/1995 | Albrecht et al. | |
| 5,465,611 A | 11/1995 | Ruf et al. | |
| 5,513,518 A | 5/1996 | Lindsay | |
| 5,515,719 A | 5/1996 | Lindsay | |
| 5,612,491 A | 3/1997 | Lindsay | |
| 5,613,861 A | 3/1997 | Smith et al. | |
| 5,831,181 A | 11/1998 | Majumdar et al. | |
| 5,939,623 A | 8/1999 | Muramatsu et al. | |
| 5,960,147 A | 9/1999 | Muramatsu et al. | |
| 6,011,261 A | 1/2000 | Ikeda et al. | |
| 6,441,359 B1 | 8/2002 | Cozier et al. | |
| 6,528,785 B1 | 3/2003 | Nakayama et al. | |
| 6,578,410 B1 * | 6/2003 | Israelachvili | 73/105 |
| 2002/0040884 A1 | 4/2002 | Hantschel et al. | |
| 2002/0047091 A1 | 4/2002 | Hantschel et al. | |
| 2002/0079445 A1 | 6/2002 | Hantschel et al. | |

OTHER PUBLICATIONS

U.S. patent application Ser. No. 10/136,258, Hantschel et al., filed Apr. 2002.*

"Nanostructure patterns written in polycarbonate by a bent optical fiber probe", pp. 2299–2300.

* cited by examiner

Primary Examiner—Nikita Wells
(74) Attorney, Agent, or Firm—Bever, Hoffman & Harms, LLP; Patrick T. Bever

(57) ABSTRACT

Scanning probe systems, which include scanning probe microscopes (SPMs) are disclosed that include cantilevered spring (e.g., stressy metal) probes and actuation/position sensing electrodes formed on a substrate. The actuation electrodes are used to position the spring probe relative to the substrate using electrostatic, magnetic, acoustic, or piezoelectric arrangements. An actuation signal source is switched between full on and off states to facilitate "ON/OFF" probe actuation in which the spring probe is either fully retracted against the substrate or deployed for scan operations. The position sensing electrodes are used to sense the deflected position of the spring probe relative to the substrate using resistive, magnetic, or piezoresistive arrangements. Spring probe arrays are disclosed that include multiple spring probes arranged on a single substrate. Each spring probe of the array includes a separate actuation electrode that is controlled using "ON/OFF" or tapping probe actuation, and may include a separate position sensing electrode.

62 Claims, 11 Drawing Sheets

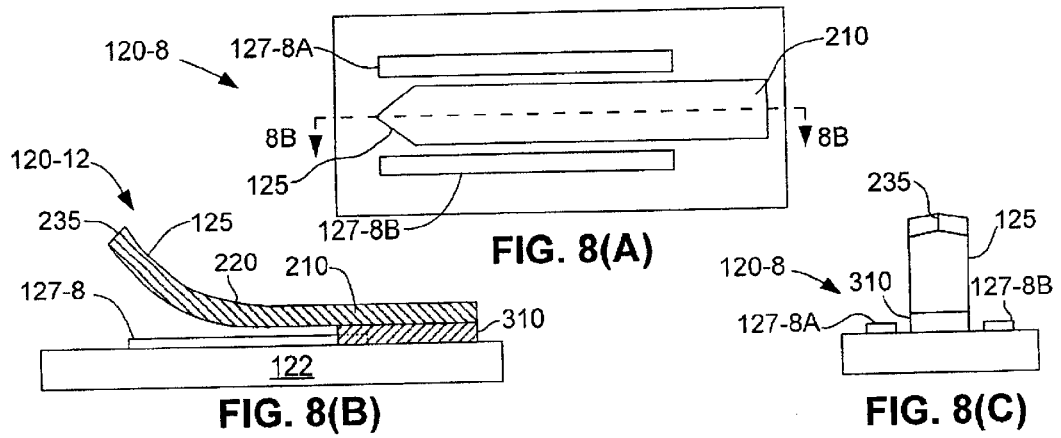
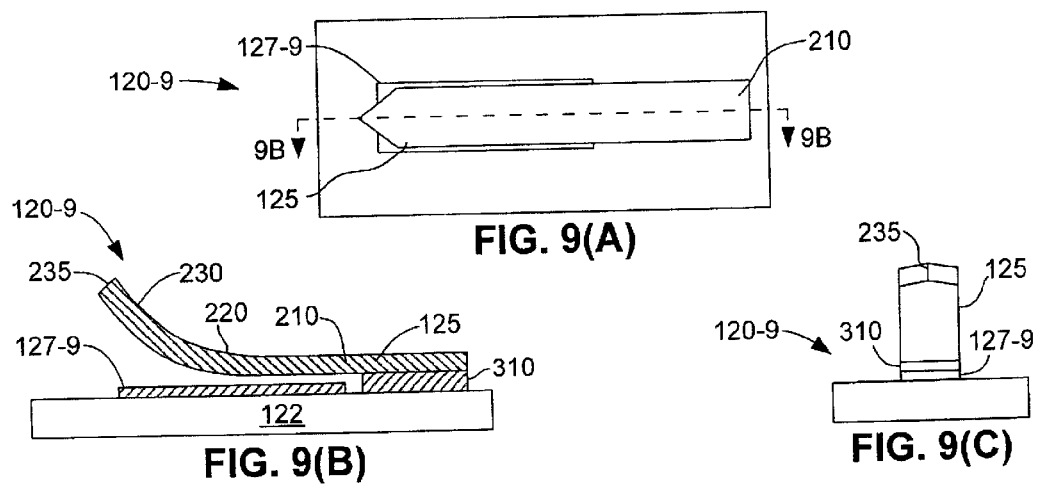
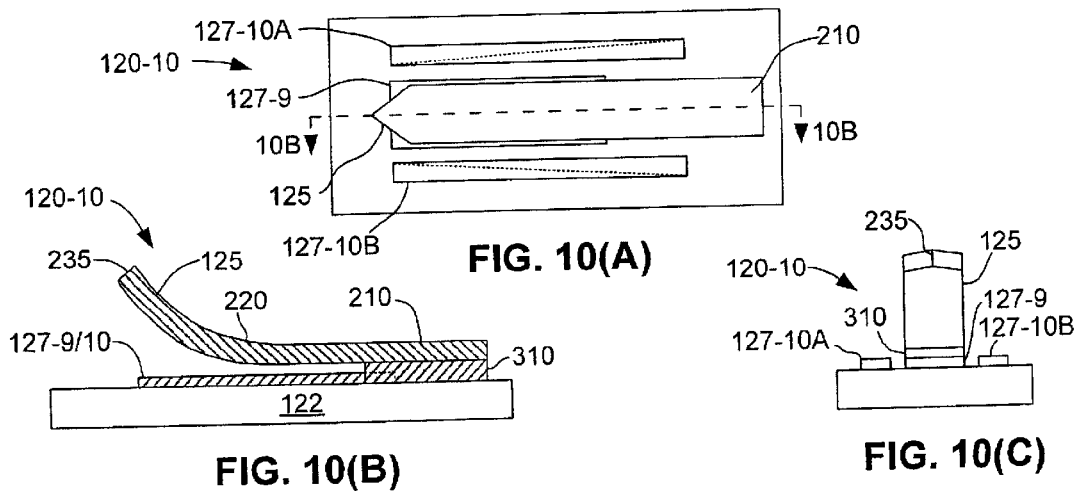

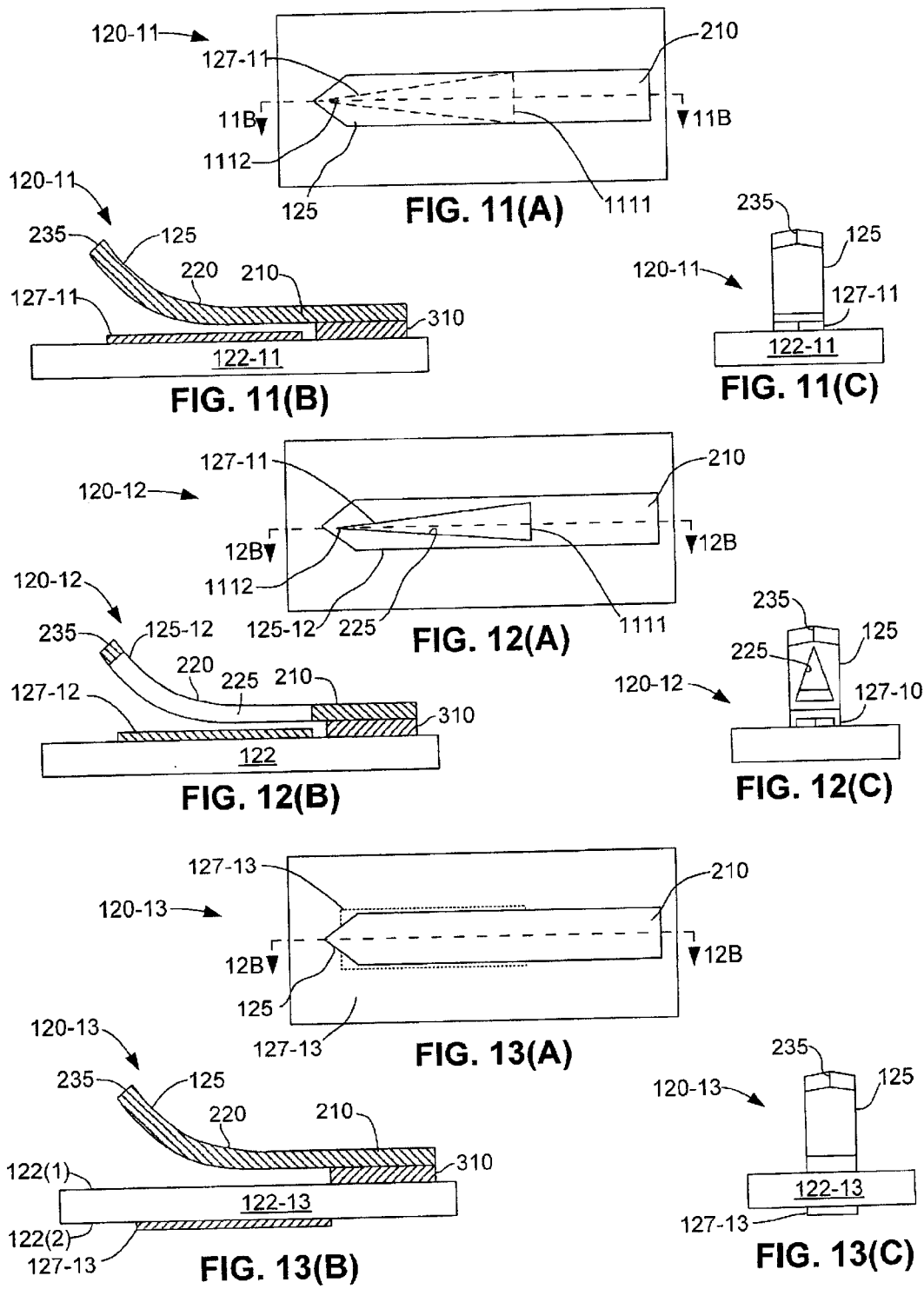

SCANNING PROBE SYSTEM WITH SPRING PROBE AND ACTUATION/SENSING STRUCTURE

RELATED APPLICATIONS

The present application is a continuation-in-part of co-owned and U.S. patent application Ser. No. 10/112,215 now U.S. Pat. No. 6,668,628, entitled "SCANNING PROBE SYSTEM WITH SPRING PROBE", which was filed on Mar. 29, 2002.

FIELD OF THE INVENTION

This invention relates generally to scanning probe systems, such as scanning probe microscopes and profilometers, and more particularly to the probe assemblies used in these scanning probe systems.

BACKGROUND OF THE INVENTION

Scanning probe microscopy (SPM; also known as atomic force microscopy (AFM)) is considered a spin-off of scanning tunneling microscopy (STM). An SPM system measures the topography of a sample by scanning (sliding) a probe having a small tip over the sample's surface and monitoring the tip position in the z-direction at each point along the scan path. Alternatively the SPM probe can be used as a nano-Spreading Resistance Probe (nano-SRP), used for the determination of the resistance and carrier profile of a semiconductor element, or for nano-potentiometry measurements of the electrical potential distribution on a semiconductor element.

FIG. 30 is a perspective view showing a conventional SPM system 40. SPM system 40 includes a movable XY stage 42 for supporting a sample 45, a probe 50 mounted to a suitable structure (holder plate) 60, a probe measurement device 70, and a computer/workstation 80 that serves as both a system controller and a measurement data processor. Holder plate 60 is movable in the z-axis direction by a suitable motor (e.g., a piezoelectric device) to selectively position probe 50 relative to sample 45. Similar motors (not shown) drive XY stage 42 in the xy-plane, thereby causing probe 50 to scan along the upper surface of sample 45, when the probe is in the lowered position. Computer 80 generates control signals that are utilized to control the movements of holder plate 60 and XY stage 42. In most conventional SPM systems, the up-and-down motion of probe 50 is detected by measurement device 70 using the so-called "optical lever" method, wherein a laser beam LB generated by a laser 72 shines onto a cantilever surface of probe 50, and the reflected beam hits a two- or four-segment photodiode 75. Measurement data generated by photodiode 75 is passed to computer 80, which processes the measurement data, and typically generates a magnified view of the scanned sample.

FIG. 31 shows probe 50 in additional detail. Probe 50 includes a holder chip (mounting block) 51, a straight cantilever section (stylus) 52 extending from holder chip 51, and an "out-of-plane" tip 55 that extends perpendicular to cantilever section 52. Probe 50 is supported by holder block 60 at an angle to facilitate contact between tip 55 and an upper surface of sample 45. The choice of the materials from which holder chip 51, cantilever section 52, and tip 55 are composed depends on the type of measurement the probe is intended for. For topography measurement, a dielectric or a semi-conductive tip can be used, whereas for resistance determination and nano potentiometry require a highly conductive tip, preferably with high hardness and low wear.

One problem associated with conventional probes is that they are expensive and difficult to produce. Conventional probes are typically formed by bulk micromachining high quality, and therefore expensive, monocrystalline silicon (Si) wafers. As indicated in FIG. 31, the relatively large size of each probe 50 is due to the integrated holder chip 51, which is mounted to holder plate 60, and cantilever 52, which must extend from under holder plate 60 to facilitate the "optical-lever" measurement method. Further, the probes are separated from the Si substrates by etching away the wafer material beneath the probe, which is a time-consuming and costly process. Because of their relatively large size, and because much of the Si substrate is etched or otherwise destroyed during the production process, relatively few probes 50 are formed from each expensive Si wafer, thereby making the cost of each conventional probe 50 relatively high.

Another problem associated with conventional probes is that out-of-plane tips 55 must be fabricated during a separate process from that used to form holder chip 51 and cantilever section 52, and probe 50 must be mounted onto holder plate 60 at an angle relative to an underlying sample 45. Conventional methods needed to form out-of-plane tips, such as tip 55 shown in FIG. 31, add time and expense to the probe manufacturing process. Most conventional out-of-plane probe tips are either etched out of a material (e.g. Si) or they are molded (a pyramidal mold is formed by anisotropic Si etching, the mold is filled up with a material such as a metal or diamond, the mold material is removed). Further, the tip height is limited to only about 15 µm, so probe 50 must be mounted onto holder plate 60 at an angle relative to an underlying sample 45 to facilitate contact between tip 55 and sample 45. To facilitate this angled probe orientation, conventional holder plate 60 is provided with an angled portion 65 to which holder chip 51 is mounted. This mounting process also takes time, and is required for each probe mounted in an SPM system.

Yet another problem associated with conventional spring probes is that, when the tip wears out, a significant amount of system downtime is required to remove and replace the worn-out probe.

What is needed is a probe structure for scanning probe systems that avoids the problems associated with conventional probes that are described above.

SUMMARY OF THE INVENTION

The present invention directed to scanning probe systems (e.g., scanning probe microscopes (SPMs)) that utilize spring probes formed from stress-engineered spring material films, and include an actuation circuit for electronically controlling the spring probe, a sensor circuit for electronically detecting the position of the spring probe, or both an actuation circuit and a sensor circuit. Each spring probe includes a fixed end (anchor portion) attached to a substrate, and a cantilever (central) section bending away from the substrate. Curvature of the cantilever section is selectively controlled during fabrication to form a long free end terminating in a tip that is located away from the substrate in an un-actuated (i.e., unbiased) state. The probe assembly, which includes the substrate, the spring probe, and optional actuation/position sensing circuits, is then mounted in a scanning probe system such that the probe tip is positioned over the surface of a sample. When the position sensing circuit is not used, a conventional measurement device (e.g., a laser beam and photosensor array) is utilized to detect tip movement while scanning.

According to a first aspect of the present invention, the actuating circuit is utilized to control the bent position of the spring probe relative to the substrate. In one series of embodiments, this actuation circuit involves electrostatic actuation utilizing an actuation electrode that is capacitively coupled to an associated spring probe. The spring probe is subsequently moved relative to the substrate by applying a differential actuation voltage to the spring probe and the actuation electrode. In one embodiment, tapered offset actuation electrodes are utilized to produce constant force, constant height, and tapping mode operations over large topographies (10s of microns), which takes advantages of the tall tip structures that can be formed by the spring probes. In other embodiments, actuation of the spring probe is performed using magnetic, acoustic and piezoelectric arrangements.

According to another aspect of the present invention, the position sensing circuit is utilized to determine the deflected position of a spring probe relative to the substrate. In one series of embodiments, this actuation circuit involves forming a resistive electrode under the spring probe, and determining the spring probe positioned by measuring the amount of current passed through the resistive element. Alternative methods, such as utilizing a piezoresistive element mounted on the spring probe, are also disclosed.

According to yet another aspect of the present invention, the various spring probe assemblies described herein are used to form inexpensive probe arrays that can significantly reduce the operating expense and down time associated with conventional scanning probe systems. As discussed above, probe tips periodically wear out, requiring system down time to replace the probe. Unlike conventional probes, multiple spring probes of the type described herein can be inexpensively fabricated on a single substrate to form a spring probe array. Further, the actuation arrangements described above can be utilized to deploy a selected spring probe while retracting the remaining spring probes of the spring probe array. Such spring probe arrays can be mounted in conventional scanning probe systems with minimal modification, and greatly reduce operating downtime (and associated expense) by allowing an operator to selectively switch between the various spring probes of the array. That is, as the tip of a spring probe wears out, the worn out spring probe is retracted and a fresh spring probe is deployed. When the substrate on which the array is formed is transparent, an optical-lever measurement system can be utilized by directing the laser beam through the substrate to strike the deployed spring probe. Alternatively, one or more of the position sensing arrangements described herein may be utilized to determine the position of the deployed spring probe. The spring probe arrays are also utilized to perform multi-point probing, multi-direction probing.

BRIEF DESCRIPTION OF THE DRAWINGS

These and other features, aspects and advantages of the present invention will become better understood with regard to the following description, appended claims, and accompanying drawings, where:

FIGS. 8(A), 8(B), and 8(C) are top, cross-sectional side, and end views, respectively showing a probe assembly incorporating actuation electrodes according to another specific embodiment of the present invention;

FIGS. 9(A), 9(B), and 9(C) are top, cross-sectional side, and end views, respectively showing a probe assembly incorporating actuation electrodes according to another specific embodiment of the present invention;

FIGS. 10(A), 10(B), and 10(C) are top, cross-sectional side, and end views, respectively showing a probe assembly incorporating actuation electrodes according to another specific embodiment of the present invention;

FIGS. 11(A), 11(B), and 11(C) are top, cross-sectional side, and end views, respectively showing a probe assembly incorporating actuation electrodes according to another specific embodiment of the present invention;

FIGS. 12(A), 12(B), and 12(C) are top, cross-sectional side, and end views, respectively showing a probe assembly incorporating actuation electrodes according to another specific embodiment of the present invention;

FIGS. 13(A), 13(B), and 13(C) are top, cross-sectional side, and end views, respectively showing a probe assembly incorporating actuation electrodes according to another specific embodiment of the present invention;

DETAILED DESCRIPTION OF THE DRAWINGS

The present invention is described below with reference to scanning probe systems, and in particular to scanning probe microscope (SPM) and profilometer systems. However, the present invention is not limited to these specific systems, and the term "scanning probe system" is defined herein to further include atomic force microscopy (AFM) systems, such as the Multimode- and Dimension-series AFMs produced by the Vecco Metrology Group of Digital Instruments (Santa Barbara, Calif.). The term "scanning probe system" is defined herein to further include magnetic force microscopy (MFM) systems, photonic force microscopy (PFM) systems, near field scanning optical microscopy (SNOM/NSOM) systems, scanning tunneling microscopy (STM) systems, force modulation microscopy (FFM) systems, scanning capacitance microscopy (SCM) systems, scanning spreading resistance microscopy (SSRM) systems, tunneling atomic force microscopy (TUNA) systems, scanning thermal microscopy (EFM) systems, electrostatic force microscopy systems, phase detection microscopy (PDM) systems, magnetic force microscopy (MFM) systems, lateral force microscopy (LFM) systems, scanning chemical force microscopy (SCFM) systems, scanning electrochemical microscopy (SEcM) systems, scanning Kelvin probe microscopy (SKPM) systems, scanning chemical potential microscopy (SCPM) systems, scanning ion conductance microscopy (SICM) systems, and nanopotentiometry systems. This list is not intended to be exhaustive.

Figure 1:
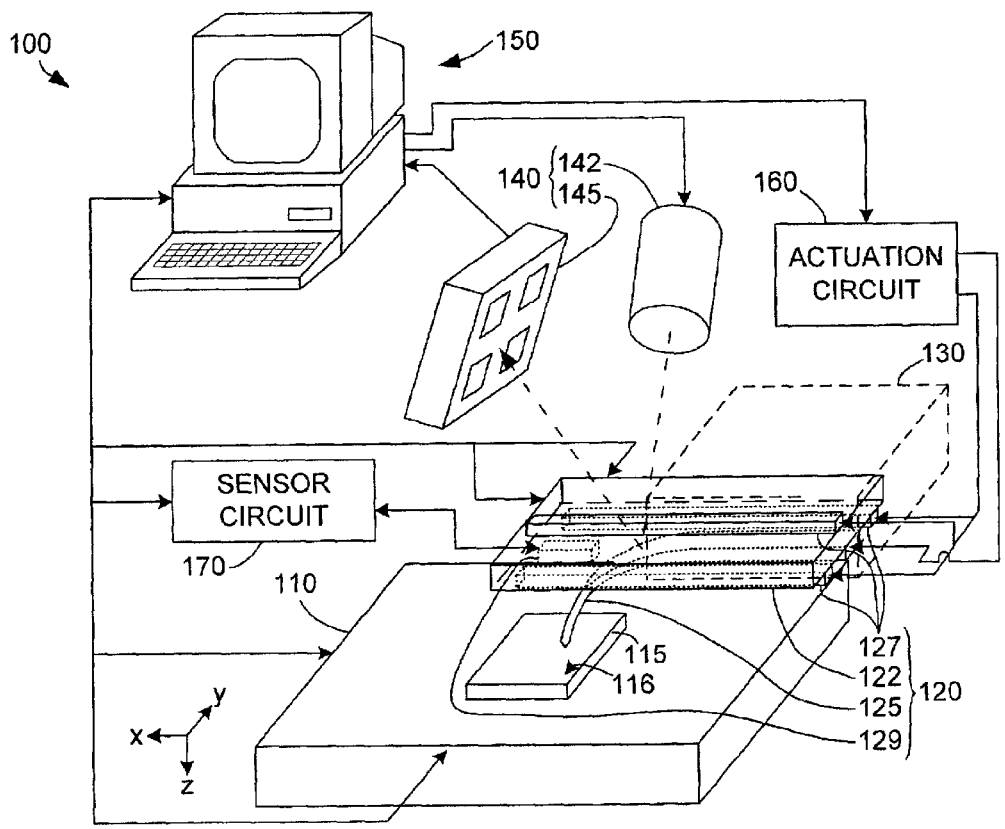
FIG. 1 is a perspective view showing a scanning probe microscope system according to a generalized embodiment of the present invention.

FIG. 1 is a perspective view showing a scanning probe system 100 according to a generalized embodiment of the present invention. Scanning probe system 100 includes an XY stage 110 for supporting a sample 115, a probe assembly 120 mounted to a suitable structure (holder plate) 130, an optional optical probe measurement device 140, a computer/workstation 150 that serves as both a system controller and a measurement data processor, an optional actuation circuit 160, and an optional sensor circuit 170. Probe assembly 120 includes a substrate 122, a curved spring probe 125 (discussed in detail below) that extends downward from substrate 122 to contact a surface 116 of sample 115, optional actuation electrode(s) 127, and optional position sensing electrode(s) 129. Holder plate 130 is typically movable in the xy-plane and/or the z-axis direction by suitable motors (e.g., one or more piezoelectric devices) to selectively position probe assembly 120 relative to sample 115. Similarly, motors (not shown) are provided to drive XY stage 110 in the xy-plane, thereby causing spring probe 125 to scan along surface 116 when spring probe 125 is in the lowered position. According to a first aspect of the present invention, electrostatic, magnetic, or piezoelectric actuation of spring probe 125 (i.e., displacement of its tip relative to substrate 122) is achieved using an actuation circuit 160 and associated structures (e.g., actuation electrodes 127), which are described in detail below. Displacement of spring probe 125 in the z-axis direction caused by topographic changes on surface 116 during scanning is detectable by optical measurement device 140, which is described below with reference to FIG. 2. Alternatively, according to a second aspect of the present invention, displacement of spring probe 125 is measured using electrostatic, magnetic, or piezoelectric measurement techniques by sensor circuit 170 and associated structures (e.g., position sensing electrode 129). Measurement data generated by optical measurement device 140 or sensor circuit 170 is passed to computer 150, which processes the measurement data, and generates usable output data (e.g., a magnified view of surface 116). Computer 150 also generates control signals that are utilized to control the movements of holder plate 130 and XY stage 110.

Figure 2:
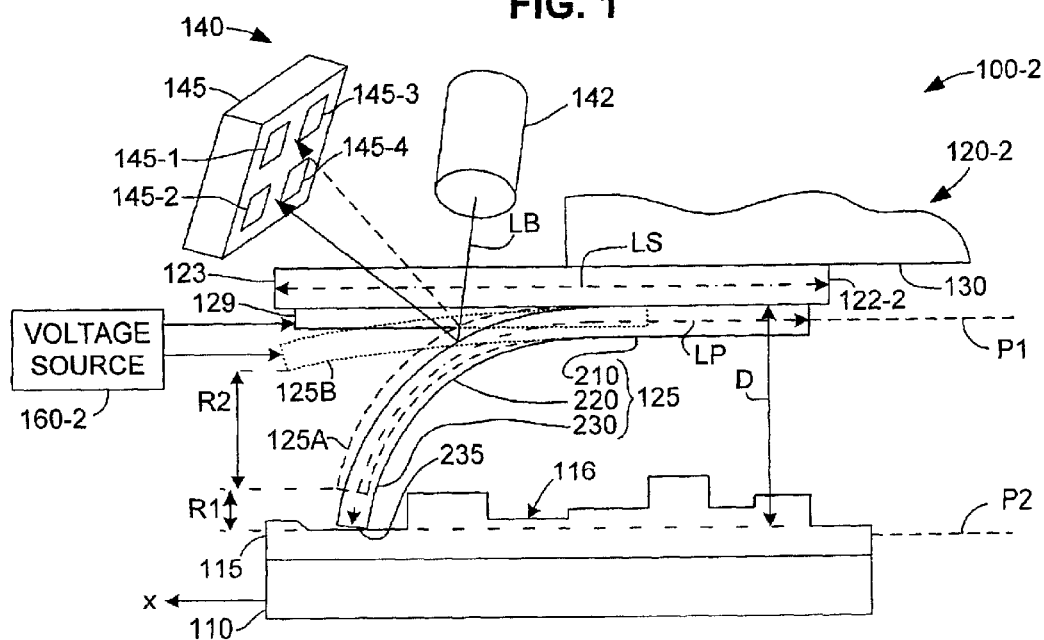
FIG. 2 is a simplified cross-sectional sectional view showing a scanning probe system including an actuation circuit according to a first aspect of the present invention.

FIG. 2 is a simplified cross-sectional sectional view showing a portion of a scanning probe system 100-2 including a probe array 120-2 according to a first specific embodiment of the present invention. As indicated in FIG. 2, spring probe 125 includes a fixed end (anchor portion) 210 attached to substrate 122-2, a curved cantilever section 220 bending away from substrate 122, and a free end 230 including a tip 235 that contacts surface 116 of sample 115. Spring probe 125 has a length LP in the range of 50 microns to one millimeter, and a width (measured perpendicular to the drawing sheet) in the range of 1 to 100 microns, with dimensions being determined by the particular use and tip formation of the probe. Substrate 122-2 has a length LS that is equal to or greater than LP, so an end 123 of substrate 122 extends over cantilever section 220 after release. During fabrication (discussed in detail below), the curvature of cantilever section 220 is selectively controlled such that tip 235 is located a distance D that is in the range of 10 $\mu$m to 1 mm from substrate 122, again depending on the particular probe application.

As shown in FIG. 2, substrate 122-2 is formed using a transparent (e.g., glass, quartz, or a plastic material such as plexiglass or SU8) material, and optical measuring device 140 includes a laser 142 and a photosensor array 145. Deflection of spring probe 125 is measured using an optical-lever method by directing a laser beam LB generated by laser 142 through transparent substrate 122, which is reflected from spring probe 125 and transmitted again through transparent substrate 122 to photosensor array 145. Displacement of probe tip 235 is measured by detecting changes in the laser light received by photosensor array 145. In particular, when tip 235 abuts low point of surface 116 (e.g., indicated in solid lines), laser beam LB is reflected from cantilever section 220 to strike a first region (e.g., adjacent sensors 145-2 and 145-4) of photosensor array 145. When tip abuts relatively high point of surface 116 and is displaced upward, the angle of cantilever section 220 is altered by a corresponding amount, resulting in laser light LB striking a different region (e.g., adjacent sensors 145-1 and 145-3) of photosensor array 145 (as indicated by long dashed lines in FIG. 2). The amount of laser light striking the different regions of photosensor array 145 are measured and passed to computer 150 (FIG. 1) for processing to form, for example, a magnified image.

In accordance with the first aspect of the present invention, scanning probe system 100-2 includes a voltage source 160-2 and one or more actuation electrodes 129 (one shown) formed on substrate 122-2 to perform electrostatic (capacitive) actuation of spring probe 125. Actuation electrode 129 is formed from a conductor (e.g., a metal such as chromium (Cr)), a semiconductor (e.g., silicon (Si)), or a compound such as transparent indium-tin-oxide (ITO). Spring probe 125 is formed using a metal or metal alloy (e.g., one or more of molybdenum (Mo), tungsten (W), titanium (Ti), chromium (Cr), nickel (Ni)), or a non-conductive material (e.g., silicon (Si), silicon oxide (SiOx), silicon nitride (SiNx), carbide, and diamond) that has a conductive material deposited thereon. Further, actuation electrode 129 is formed adjacent to cantilever section 220 and free end 230 of spring probe 125, and patterned such that sufficient capacitive coupling is achieved between actuation electrode 129 and spring probe 125 to cause actuation (i.e., displacement) of probe tip 235 relative to substrate 122-2 in response to an applied voltage signal generated by voltage source 160-2. With this arrangement, electrostatic actuation is achieved either by applying either a DC or AC bias to actuation electrode 129 and spring probe 125, or by applying a DC bias plus an AC voltage. A pure DC bias (e.g., 50 to 250 Volts) is used when spring probe 125 is operated in an "ON/OFF" operating mode (i.e., pulled against the substrate, or fully deployed), or when spring probe 125 is selectively made stiffer (i.e., higher spring constant) by pulling it partially toward substrate 122. When the applied voltage is an AC voltage near a resonant frequency of spring probe 125 (which is determined by its thickness, length, etc.), spring probe 125 is actuated in a "tapping" mode in which probe tip 235 vibrates rapidly over a desired range R1 (shown in FIG. 2). Scanning probe system 100 supports low amplitude tapping mode vibrations (i.e., in the nanometer range), which are utilized in conventional scanning probe systems. In addition, scanning probe system 100 supports large amplitude vibrations, in which probe tip 235 vibrates in the range of a few microns to tens of microns, due to the use of spring probe 125 (such large amplitude vibrations are not possible in SPM systems utilizing conventional probes). Furthermore, a DC bias with superimposed AC bias can combined such that the DC biases determines the spring constant of spring probe 125 (and hence its resonance frequency), and the AC bias is used to vibrate the spring to perform "tapping mode" operations.

Several exemplary electrostatic actuation electrode patterns are described below with reference to the specific embodiments shown in FIGS. 3(A) through 14.

Figure 3A:
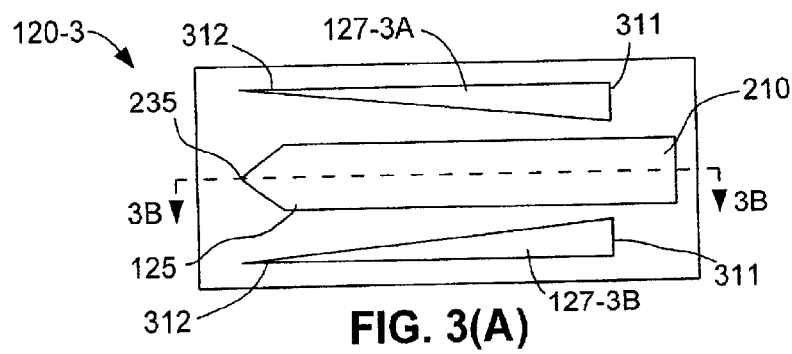
FIGS. 3(A), 3(B), and 3(C) are top, cross-sectional side, and end views, respectively, showing a probe assembly incorporating actuation electrodes according to a first specific embodiment of the present invention.
Figure 3B:
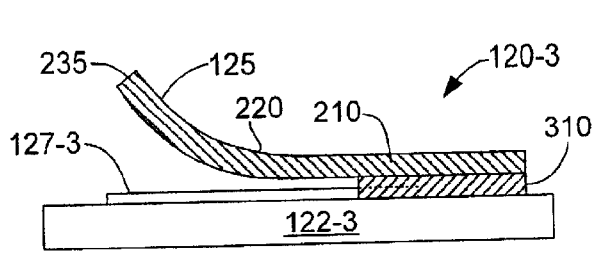
Figure 3C:
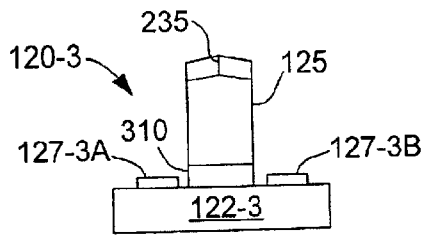

FIGS. 3(A) through 3(C) are top, cross-sectional side, and end views, respectively, showing a probe assembly 120-3 incorporating an actuation electrode structure including a first elongated electrode portion 127-3A and a second elongated electrode portion 127-3B formed on substrate 122-3 and extending parallel to and offset from the sides of spring probe 125. Each elongated electrode portions 127-3A and 127-3B has a tapered shape including a relatively wide portion 311 located adjacent to fixed end 210 of spring probe 125, and a relatively narrow portion 312 located adjacent to probe tip 235. The present inventors have determined that tapered electrode portions 127-3A and 127-3B reduce forces exerted along the length of spring probe 125 due to the diminished field strength (along its length) inherent to the tapered electrode design, thereby facilitating a stable "rolling/zipper" motion of spring probe 125 (described below with reference to FIGS. 4(A) through 4(C). Further, by offsetting tapered electrode portions 127-3A and 127-3B from (i.e., mounting on opposite sides of) spring probe 125, the actuation voltage needed to achieve full deflection of probe tip 235 is minimized.

Figure 4A:
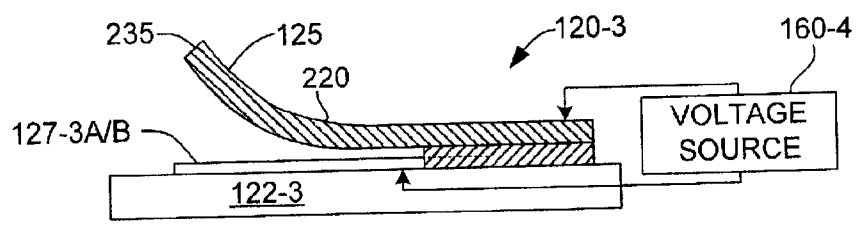
FIGS. 4(A), 4(B), and 4(C) are cross-sectional side views depicting actuation of the spring probe assembly of FIG. 3(B)
Figure 4B:
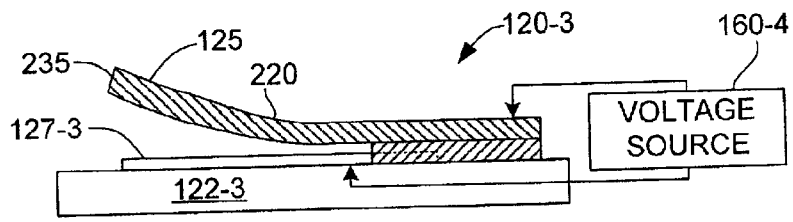
Figure 4C:
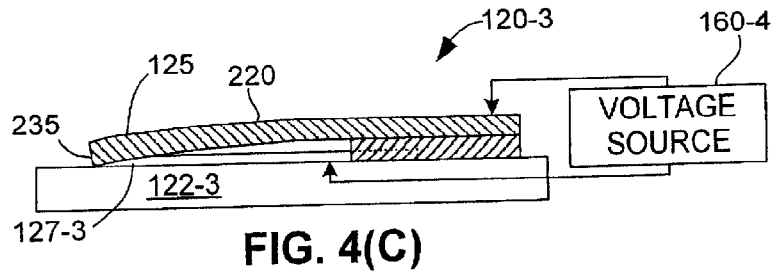

FIGS. 4(A) through 4(C) are cross-sectional side views illustrating the "rolling/zipper" motion of spring probe 125. Referring to FIG. 4(A), when a relatively small voltage signal is applied by a voltage source 160-4 to spring probe 125 and elongated electrode portions 127-3A and 127-3B, cantilever section 220 remains substantially in its unbiased position (i.e., bent into a shape determined by the spring probe design). As shown in FIG. 4(B), as the applied voltage generated by voltage source 160-4 increases, cantilever section 220 is pulled toward substrate 122-3 and straightened, thereby "unrolling" spring probe 125. As shown in FIG. 4(C), when the applied voltage generated by voltage source 160-4 reaches a sufficiently large value, spring probe 125 is further unrolled until tip 235 abuts substrate 122-3.

FIGS. 5(A) through 5(J) are simplified cross-sectional side views showing a general fabrication process utilized to produce probe assembly 120-3 according to another embodiment of the present invention.

Figure 5A:
FIGS. 5(A), 5(B), 5(C), 5(D), 5(E), 5(F), 5(G), 5(H), 5(I), and 5(J) are simplified cross-sectional side views showing a general fabrication process utilized to produce probe assemblies according to another aspect of the present invention.

Referring to FIG. 5(A), the fabrication process begins by forming an electrically conducting layer 503 (e.g., Cr or a doped semiconductor film) on a wafer 501. Wafer 501 is formed from a selected substrate material (e.g., glass, quartz, silicon (Si), sapphire, aluminum oxide, or a suitable plastic). As described herein, a transparent wafer material provides additional advantages in many SPM applications.

Figure 5B:
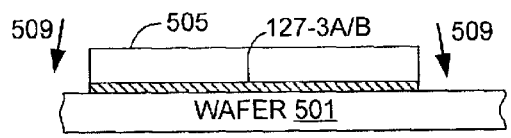
Figure 6:
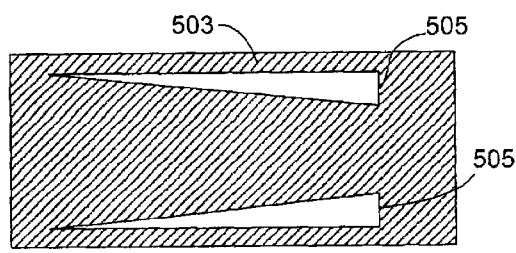
FIG. 6 is a top view showing an electrode mask formed over a first metal film during the fabrication process shown in FIG. 5(B)

Referring to FIGS. 5(B) and 6, elongated electrode masks 505 (e.g., photoresist) are then patterned over selected portions of metal film 503. As indicated in FIG. 6, each electrode mask 505 is formed with the tapered shape of the desired spring probe. Returning to FIG. 5(B), the metal film is then wet etched using a suitable etchant 509 to form electrode portions 127-3A and 127-3B, and conductive traces (not shown) utilized to transmit actuating voltages to electrode portions 127-3A and 127-3B. Electrode masks 505 are subsequently removed.

Figure 5C:
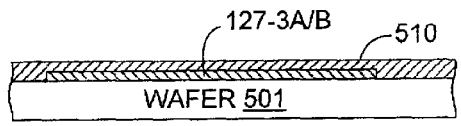

Referring to FIG. 5(C), a release layer 510 is then deposited on wafer 501 and over electrodes 127-3A and 127-3B. In one embodiment, release layer 510 includes amorphous silicon (a-Si). Alternative release layer materials include a silicon nitride composition (SiNx), a silicon oxide composition (SiOx), and titanium (Ti). As described below, the release material is selected such that the spring probe remains connected via a portion of release material layer 510 to wafer/substrate 501 after release. In an alternative embodiment, a separate anchor pad is separately formed adjacent to the release material that serves to connect the spring probe to wafer/substrate 510. While such a separately formed anchor pad may increase the strength of the spring probe/substrate connection, the formation of such an anchor pad would increase the number of process steps, thereby increasing the total probe manufacturing cost. In yet another alternative embodiment, the substrate material of wafer 501 may itself be used as the release layer 510, (i.e., a separate release material deposition process is not used, and spring probe 125 is connected directly to substrate 122, as shown in FIG. 2).

Figure 5D:
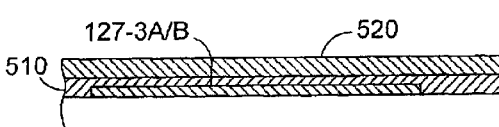

Next, as shown in FIG. 5(D), a stress-engineered (spring) film 520 is formed on release layer 510 using known processing techniques such that film 520 includes internal stress variations in the growth direction. For example, in one embodiment, spring material film 520 is formed such that its lowermost portions (i.e., adjacent to release material layer 510) has a higher internal compressive stress than its upper portions, thereby forming internal stress variations that cause a bending bias away from wafer 501. Methods for generating such internal stress variations in spring material film 520 are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, stress-engineered spring material film 520 includes one or more metals suitable for forming a spring structure (e.g., one or more of molybdenum (Mo), a "moly-chrome" alloy (MoCr), tungsten (W), a titanium-tungsten alloy (Ti:W), chromium (Cr), and nickel (Ni)). In other embodiments, spring material film 520 is formed using Si, nitride, oxide, carbide, or diamond, but such non-metal probe materials would require a conductive coating to facilitate capacitive coupling with actuation electrode portions 127-3A and 127-3B. The thickness of spring material film 520 is determined in part by the selected spring material, desired spring constant and shape of the final spring structure, as discussed in additional detail below.

Figure 5E:
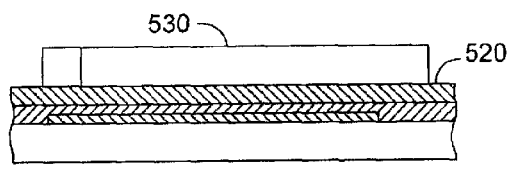
Figure 7:
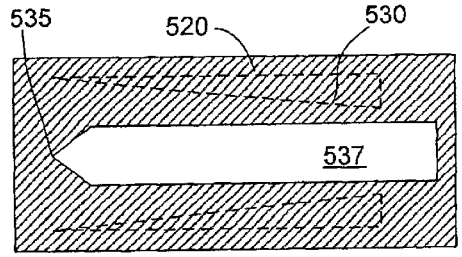
FIG. 7 a top view showing a spring mask formed over a spring material film during the fabrication process shown in FIG. 5(E)

Referring to FIGS. 5(E) and 7, elongated spring masks 530 (e.g., photoresist) are then patterned over selected portions of spring material film 520. Note that each spring mask 530 is formed in the shape of the desired spring probe, and may include a pointed tip 535 at one end, as shown in FIG. 7. In alternative embodiments, the ends of spring mask 530 may be blunted to provide a suitable platform for forming an out-of-plane tip. Note that a base portion 537 of mask 530 that is used to form the fixed (anchor) portion of the spring probe is depicted as being rectangular, but can have any selected shape (e.g., V-shape, U-shaped, J-shaped, L-shaped, etc.). The fixed end of the subsequently formed spring probe may thus be formed wider than the cantilever section.

Figure 5F:
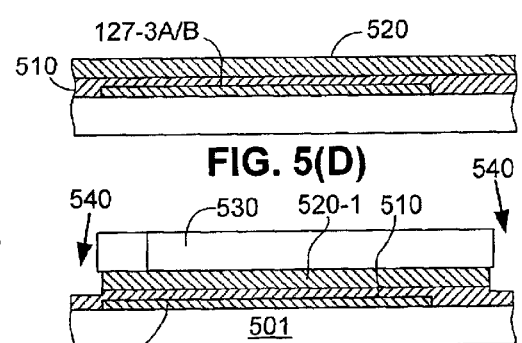

Next, as indicated in FIG. 5(F), exposed portions of spring material film 520 surrounding spring mask 530 are etched using one or more etchants 540 to form a spring island 520-1. Note that this etching process is performed such that limited etching occurs in release layer 510 surrounding spring material island 520-1. In one embodiment, the etching step may be performed using, for example, a wet etching process to remove exposed portions of spring material film 520, thereby re-exposing electrode portions 127-3A and 127-3B. This embodiment was successfully performed using cerric ammonium nitrate solution to remove a MoCr spring metal layer. In another embodiment, anisotropic dry etching is used to etch both spring material film 520 and the upper surface of release layer portion 510B. This embodiment may be performed, for example, with Mo spring metal, and Si or Ti release layers. Mo, Si and Ti all etch in reactive fluorine plasmas. An advantage of dry etching the spring material film is that it facilitates finer features and sharper tipped spring probes. Materials that do not etch in reactive plasmas may still be etched anisotropically by physical ion etching methods, such as Argon ion milling. In yet another possible embodiment, the etching step can be performed using the electro-chemical etching process described in IBM J. Res. Dev. Vol. 42, No. 5, page 655 (Sep. 5, 1998), which is incorporated herein by reference. Many additional process variations and material substitutions are therefore possible and the examples given are not intended to be limiting.

Figure 5G:
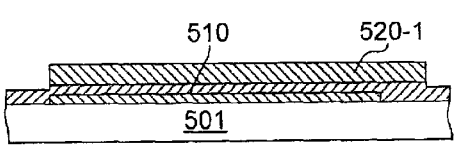
Figure 5H:
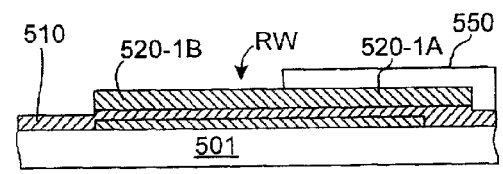

FIG. 5(G) shows spring material island 520-1, electrode portions 127-3A and 127-3B, and release material 510 after spring mask 530 (FIG. 5(D)) is removed. Next, as shown in FIG. 5(H), a release mask 550 is formed on a first portion 520-1A of spring material island 520-1. Release mask 550 defines a release window RW, which exposes a second portion 520-1B of spring material island 520-1 and surrounding portions release material layer 510, including electrode portions 127-3A and 127-3B. Release mask 550 may also serve as a strapping structure to further secure first portion 520-1A (i.e., fixed end 210; see FIG. 2) to wafer 501. In one embodiment, release mask 550 is formed using photoresist. In other embodiments, a suitable metal or epoxy may be used.

Figure 5I:
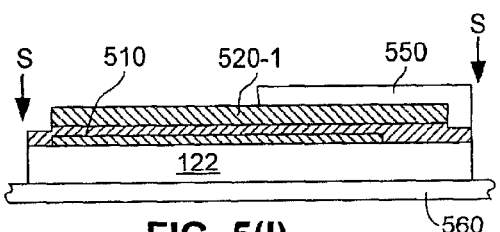

Referring to FIG. 5(I), the wafer is diced (indicated by arrows S) to form substrate 122, which is further processed (if necessary) to modify substrate 122 for attachment to holder plate 130 (see FIG. 1). In the present embodiment, dicing is performed before spring material island 520-1 is released from release layer 510 (described below with reference to FIG. 5(H)) to prevent damage to the lifted structure, for example, by a water jet used to perform the dicing process. Dicing after release would require beam structure passivation, for example, using resist or wax. After dicing, each substrate 122 is held into place by a sticky dicing tape 560 (i.e., the dicing blade only cuts through the wafer but not through the underlying sticky dicing tape 560).

Figure 5J:
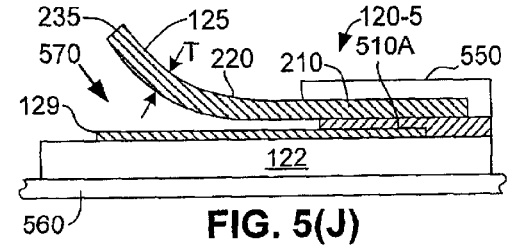

Finally, as indicated in FIG. 5(J), a release etchant 570 (e.g., a $XeF_2$ dry etch) is then use to selectively remove a portion of the release material layer from beneath the exposed portion of the spring material island to form spring probe 125. Specifically, removal of the exposed release material causes cantilever section 220 to bend away from substrate 122 due to the internal stress variations established during the formation of the spring material film (discussed above). Note that fixed end (anchor portion 210) remains secured to substrate 122 by release material (support) portion 510A, which is protected by release mask 550. Note also that resist mask 550 may be optionally removed from fixed end 210 of spring probe 125 after release. The release step can be done with all diced chips on dicing tape 560, which is subsequently removed to separate individual probe assemblies 120-5. After being removed from dicing tape 560, probe assembly 120-5 is mounted onto an SPM holder chip using a double-side sticky tape, or by clamping, soldering or gluing. Probe assembly 120-5 is now ready for use in an SPM system, such as that shown in FIG. 1.

Another advantage of the present invention over conventional probes is that the above-described fabrication process is significantly less expensive than that required to produce conventional probes having electrostatic or other on-beam actuating mechanisms. Conventional probes are typically bulk micromachined from high-quality, and therefore expensive, monocrystalline Si substrates. Conventional probes require etching away the entire substrate beneath each probe, which is a time-consuming and costly process, and yields a relatively small number of probes per wafer. In comparison, the electrodes and spring probes of the present invention are formed using a relatively inexpensive lithographic process that yields a significantly larger number of spring probes per wafer. Another advantage is that spring probe fabrication uses a mask aligner with only topside alignment capability, whereas conventional probe fabrication requires special and expensive aligners with backside alignment capability.

As mentioned above, spring probe 125 (see FIG. 5(H)) has a stiffness (spring constant) that is generally determined by its thickness T in the growth direction, its length, and to a lesser extend, its width. For measuring topography in an SPM contact mode, the spring constant should be relatively low (1–3 N/m or smaller). A relatively low spring constant can be produced using a relatively thin stress-engineered spring material film 520 (e.g., $\leq 1.5$ $\mu$m) and forming a relatively long spring material island (e.g., greater than 100 microns). Spring probes with higher spring constants (e.g., 5–50 N/m) can be produced using shorter and/or thicker spring material islands. Such high spring constant probes are used, for example, for tapping mode measurements (i.e., where the cantilever section is vibrated near a resonance frequency) and electrical SPM measurements (i.e., to facilitate relatively hard pressing of the probe tip against the sample to make good electrical contact).

Several additional advantages associated with the present invention arise from the ability to form "in-plane" probe tips, as compared with the out-of-plane tips utilized in conventional probes. In-plane tips are formed in (or parallel to) the plane defined by the stress-engineered spring material film, but point away from this plane when the spring probe is released. In-plane tips can either be formed by shaping the spring material film to form a sharp point (tip), or by forming a tip material layer over the spring material film. When an in-plane tip is formed by shaping the spring material into a sharp point, this shaping is during the spring material film etching process (described above with reference to FIGS. 5(F) and 7). The sharp point is directed along the surface of the substrate before release, but points away from the substrate after release. Such in-plane tips are less expensive to produce than conventional out-of-plane tips because the additional processing needed to produce the out-of-plane tips is eliminated. Further, in-plane tips allow for narrower probe widths at free end 230 than is possible using conventional probes, which require wide cantilever sections to produce and support the out-of-plane tips. These narrower free end widths facilitate visual inspection of the probed region, which is difficult using conventional probes because the wide cantilever obscures the necessary line of sight to the probed region.

FIGS. 8(A)–8(C) are top, cross-sectional side, and end views, respectively, showing a probe assembly 120-8 incorporating elongated actuation electrode portions 127-8A and 127-8B according to another specific embodiment of the present invention. Similar to electrode portions 127-3A and 127-3B (discussed above with reference to FIGS. 3(A)–3(C)), electrode portions 127-8A and 127-8B are offset from (i.e., patterned to extend along the sides of, and not underneath) spring probe 125. However, electrode portions 127-8A and 127-8B differ from electrode portions 127-3A and 127-3B in that they are substantially rectangular shaped (instead of tapered). While this rectangular electrode shape may produce less stability during actuation ("roll out") than the tapered electrode shape, it is suitable for many applications.

FIGS. 9(A)–9(C) are top, cross-sectional side, and end views, respectively, showing a probe assembly 120-9 incorporating a single actuation electrode 127-9 located under spring probe 125 according to another specific embodiment of the present invention. In particular, electrode 127-9 is located between substrate 122-9 and central section 220 and/or free end 230 of spring probe 125. By placing electrode 127-9 directly under spring probe 125, actuation of spring probe 125 requires a lower operational voltage than that required in the offset electrode embodiments described above. However, the under-probe arrangement of the present embodiment produces greater instability during actuation of spring probe 125. The present inventors determined that once a minimum required actuation voltage was applied, and subsequently a minimum electrode separation was achieved (i.e., adjacent anchor portion 210), this separation was maintained and propagated along the length of spring probe 125 for the given minimum voltage. Hence, this arrangement was deemed relatively unstable, and only appropriate for either very small DC deflections or an AC "tapping" operation mode. Greater applied voltages than the stated minimum (as low as 20 volts depending on design) would result in the cantilever section "snapping" down as opposed to "rolling" out smoothly and controllably.

FIGS. 10(A)–10(C) are top, cross-sectional side, and end views, respectively, showing a probe assembly incorporating both offset electrode portions 127-10A and 127-10B, and under-probe electrode 127-9 (discussed above) according to another specific embodiment of the present invention. By separately controlling these electrodes, the beneficial aspects of both electrode type can be selectively achieved for a given situation. For example, when a stable and smooth "rolling/zipper" motion is required, under-probe electrode 127-9 is deactivated, and appropriate actuation voltages are applied to offset electrode portions 127-10A and 127-10B (which can be either tapered, as described above with reference to probe assembly 120-3, or rectangular, as described above with reference to probe assembly 120-8). Conversely, when the actuation motion is not important and partial sring probe deflection is required (e.g., tapping mode operation), offset electrode portions 127-10A and 127-10B are deactivated, and an appropriate actuation voltage (which is typically lower than that required to produce the same operation using offset electrode portions 127-10A and 127-10B) is applied to under-probe electrode 127-9.

FIGS. 11(A)–11(C) are top, cross-sectional side, and end views, respectively, showing a probe assembly 120-11 incorporating an actuation electrode 127-11 according to another yet specific embodiment of the present invention. Similar to actuation electrode 127-9 (discussed above), actuation electrode 127-11 is located between substrate 122-11 and central section 220/free end 230 of spring probe 125. However, actuation electrode 127-11 includes a tapered (triangular) shape having a relatively wide portion 1111 located adjacent to fixed end 210 of spring probe 125, and a relatively narrow portion 1112 located adjacent to probe tip 235. In effect, electrode 127-11 incorporates some of the stability provided by tapered electrodes with the lower actuating voltage benefits of under-probe electrodes.

FIGS. 12(A)–(C) are top, cross-sectional side, and end views, respectively, showing a probe assembly 120-12 incorporating actuation electrode 127-11 (discussed above) along with a modified spring probe 125-12 according to another specific embodiment of the present invention. As discussed above, actuation electrode 127-11 includes a tapered (triangular) shape having a relatively wide portion 1111 located adjacent to fixed end 210 of spring probe 125-12, and a relatively narrow portion 1112 located adjacent to probe tip 235. In addition, spring probe 125-12 is modified to include a triangular (tapered) opening 225 located over actuation electrode 127-11 (i.e., such that a wide end of opening 225 is located over wide portion 1111, and a narrow end of opening 225 is located over narrow portion 1112. This arrangement further increases stability over probe assembly 120-11 by combining the stability provided by tapered and offset (i.e., not directly under spring probe 125-12) electrodes with the lower actuating voltage benefits of under-probe electrodes.

FIGS. 13(A)–13(C) are top, cross-sectional side, and end views, respectively showing a probe assembly 120-13 incorporating an actuation electrode 127-13 according to yet another specific embodiment of the present invention. Similar to the previously described actuation electrodes, actuation electrode 127-13 is formed on the same substrate 122-13 to which spring probe 125 is attached. However, unlike the previously-described actuation electrodes, electrode 127-13 is mounted on a (second) surface 122(2) of substrate 122-13 that is opposite to the a (first) surface 122(1) to which spring probe 125 is attached. Because actuation electrode 127-13 is further from spring probe 125 (i.e., the thickness of substrate 122-13) than the embodiments described above, a higher actuation voltage is typically required to actuate spring probe 125. In one embodiment, actuation electrode 127-13 is formed using a transparent conductive material, such as ITO, to facilitate optical-lever measurements. Coupling is maximized by forming actuation electrode 127-13 over the entire surface 122(2) of substrate 122-13, but in some embodiments a suitable actuation force is achieved with actuation electrode 127-13 formed only over a portion of surface 122(2).

Figure 14:
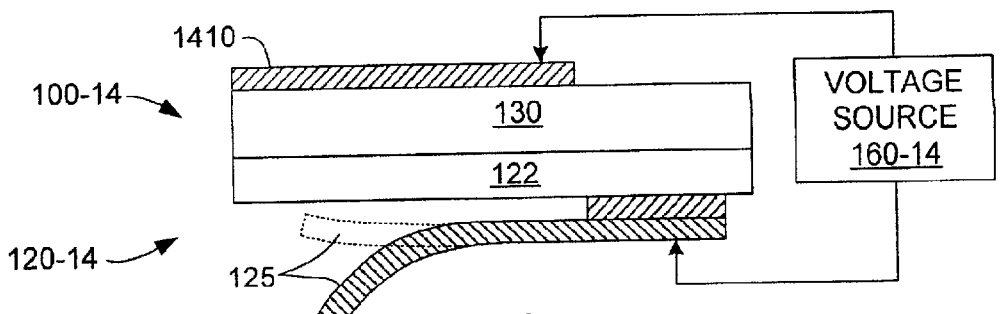
FIG. 14 is a side view showing a spring probe system including an electrostatic actuation system according to yet another embodiment of the present invention.

FIG. 14 is a side view showing a portion of a scanning probe system 100-14 according to yet another embodiment in which an external actuation electrode 1410 is placed, for example, on holder plate 130 or on another structure of scanning probe system 100-14 (i.e., not on substrate 122 of probe assembly 120-14). As in the embodiments described above, external actuation electrode 1410 is positioned such that it is capacitively coupled to spring probe 125, and a voltage (signal source) 160-14 applies an appropriate actuating voltage to spring probe 125 and actuation electrode 1410, thereby pulling spring probe 125 toward substrate 122 during actuation. As with the embodiment shown in FIG. 13(B), because actuation electrode 1410 is further from spring probe 125 (i.e., the thickness of substrate 122 plus the thickness of holder 130), a higher actuation voltage is typically required. The required actuation voltage is somewhat lower if actuation electrode 1410 is placed on a bottom surface of holder plate 130 (i.e., between holder plate 130 and substrate 122). Actuation electrode 1410 may also be formed using a transparent conductive material, such as ITO.

Actuation electrodes that are spaced relatively far from spring probe 125, such as those shown in FIGS. 13(B) and 14, can be used to vibrate spring probe 125 with amplitudes in the nanometer range for non-contact measurements using relatively high voltages (e.g., 100–200 Volts). However, spring probe 125 typically cannot be pulled against substrate 122 (as indicated in dashed lines in FIG. 14) when such electrode arrangements are used because they are positioned too far from spring probe 125 (i.e., the electrical force too small).

In addition to the electrostatic actuation embodiments described above, several alternative actuation arrangements can also be utilized. Examples of these alternative actuation arrangements are described below.

Figure 15:
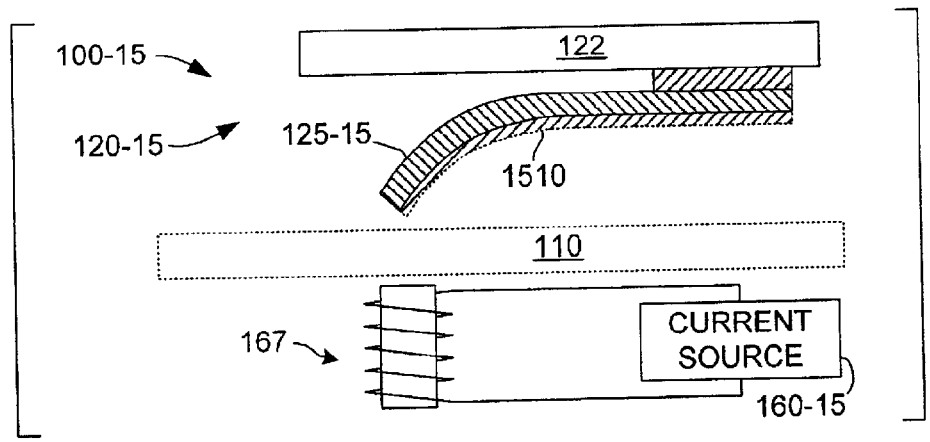
FIG. 15 is a side view showing a spring probe system including a magnetic actuation system according to yet another embodiment of the present invention.

FIG. 15 is a side view showing portions of a scanning probe system 100-15 according to another embodiment of the present invention in which actuation of a spring probe is performed using a magnetic actuating arrangement. Referring to FIG. 15, scanning probe system 100-15 includes a probe assembly 120-15 including a spring probe 125-15 that is at least partially formed using a magnetic spring material (e.g., nickel (Ni)). In addition, a magnetic actuating circuit is provided that includes a current source 160-15 and a magnetic coil structure 167 that is positioned in the vicinity of spring probe 125-15 (e.g., below stage 110). With this arrangement, an actuating current generated by current source 160-15 causes coil structure 167 to generate a changing magnetic field that magnetically vibrates spring probe 125-15. Alternatively, scanning probe system 100-15 may be formed such that spring probe 125-15 is formed from a non-magnetic material having a magnetic coating 1510 (e.g., CoCr) formed thereon using known techniques. In an alternative embodiment, the magnetic coil arrangement shown in FIG. 15 may be replaced with a permanent magnet, and either spring probe 125 or the permanent magnet are moved vertically to generate a changing magnetic field.

Figure 16:
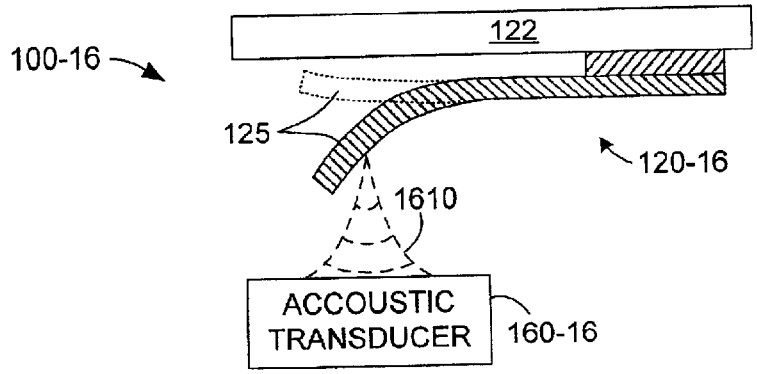
FIG. 16 is a side view showing a spring probe system including an acoustic actuation system according to yet another embodiment of the present invention.

FIG. 16 shows a portion of a scanning probe system 100-16 including a accoustic actuating arrangement according to yet another embodiment of the present invention. Scanning probe system 100-16 includes a probe assembly 120-16 including a spring probe 125 formed as described above, and mounted over an acoustic transducer 160-16. Acoustic transducer actuates spring probe 120-16 by "shooting" acoustic waves 1610 at its cantilever section in a manner similar to that described in "Actuation and Characterization of Atomic Force Microscope Cantilevers in Fluids", F. L. Degertekin, B. Hadimioglu, T. Sulchek and C. F. Quate, Appl. Phys. Lett. 78(11), pp: 1638–1630, 2001, and "Actuation of Atomic Force Microscope Cantilevers in Fluids Using Acoustic Radiation Pressure", A. G. Onaran, F. L. Degertekin, B. Hadimioglu, T. Sulchek, and C. F. Quate, Proceedings of MEMS 2002, pp. 356–359, 2002, which are incorporated herein by reference in their entirety. An advantage of scanning probe system 100-16 is that acoustic transducer 160-16 is reusable, and only the relatively inexpensive spring probe 125 is changed when the probe tip wears out.

Figure 17:
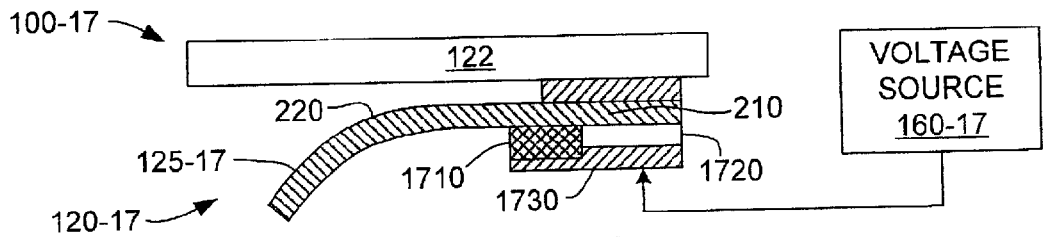
FIG. 17 is a side view showing a spring probe system including a piezoelectric actuation system according to yet another embodiment of the present invention.

FIG. 17 shows a portion of a scanning probe system 100-17 including a piezoelectric actuating arrangement according to yet another embodiment of the present invention. Scanning probe system 100-17 includes a probe assembly 120-17 including a spring probe 125-17 in which a piezoelectric actuation element 1710 is formed over a portion of cantilever section 220, and a voltage source 160-17 for driving piezoelectric actuation element 1710. In addition, an insulating material portion 1720 is formed over fixed portion 210, and an electrode 1730 is formed over piezoelectric actuation element 1710 and insulating material portion 1720. The actuating voltage generated by voltage source 160-17 is transmitted to piezoelectric actuation element 1710 via electrode 1730. During operation, the actuating voltage applied across the piezoelectric actuating element 1710 induces an expansion or contraction that actuates (deforms) spring probe 125-17. This arrangement can be used for tapping mode or constant force actuation. The bandwidth of such an actuator arrangement is typically 10s of kHz, which is higher than the bulk actuator used commercially to actuate the entire probe assembly in conventional systems (i.e., ~5 kHz bandwidth), but much less than the bandwidth of capacitive actuation arrangements described above (which are limited only by the mechanical resonance of the probe). For applications in a conductive medium (e.g., water), this piezoelectric actuator arrangement provides an advantage in that the electric field lines are confined to the surface of spring probe 125-17. In contrast, the electric field lines in capacitive actuation arrangements span the distance between the probe and the actuating electrode, which could damage the sample or cause electrolysis in water.

Referring again to FIG. 1, in accordance with the second aspect of the present invention, scanning probe system 100 includes an optional position sensing arrangement (e.g., one or more position sensing electrodes 129 and sensor circuit 170) that is used in place of measurement device 140 to determine the deflected position of spring probe 125. In one embodiment of the present invention, a scanning probe system includes both one of the actuation arrangements described above and one of the position sensing arrangements described below. In another embodiment of the present invention, a scanning probe system includes only a position sensing arrangement (i.e., no actuation arrangement is included). Exemplary probe assemblies incorporating such position sensing arrangements are described below with reference to FIGS. 18(A)–23.

Figure 18A:
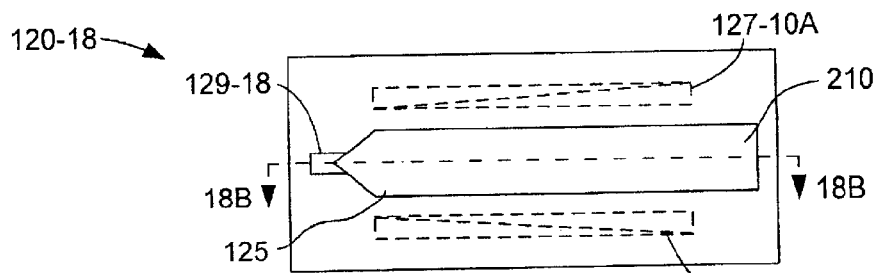
FIGS. 18(A), 18(B), and 18(C) are top, cross-sectional side, and end views, respectively showing a probe assembly incorporating a position sensing electrode according to another aspect of the present invention.
Figure 18B:
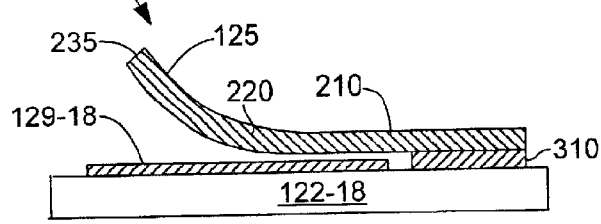
Figure 18C:
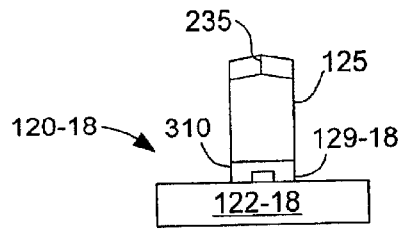

FIGS. 18(A)–18(C) are top, cross-sectional side, and end views, respectively, showing a probe assembly 120-18 incorporating resistive position sensing electrode 129-18 according to another embodiment of the present invention. Position sensing electrode 129-18 is formed on a substrate 122-18 and positioned underneath spring probe 125 such that cantilever section 220 contacts position sensing electrode 129-18 when spring probe 125 is deflected toward substrate 122-18. The deflected position of actuated or otherwise "unrolled" spring probe 125 (i.e., point where spring probe 125 makes mechanical contact to substrate 122-18) is sensed using a resistive contact measurement provided by position sensing electrode 129-18, as described below with reference to FIGS. 19(A)–19(C).

Figure 19A:
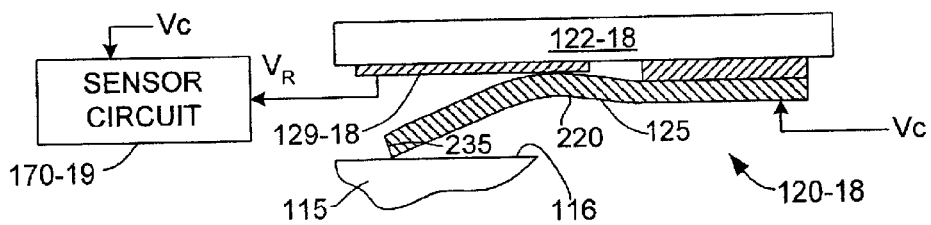
FIGS. 19(A), 19(B), and 19(C) are cross-sectional side views depicting the operation of the spring probe assembly of FIG. 18(B)
Figure 19B:
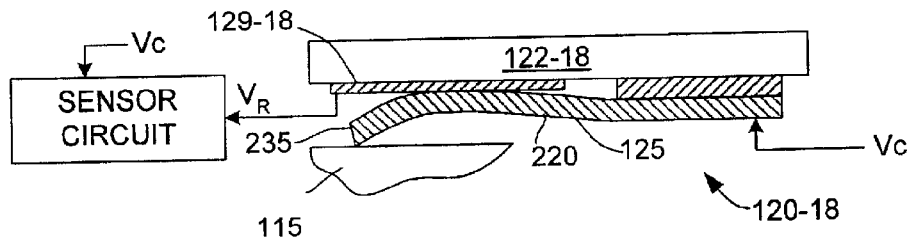
Figure 19C:
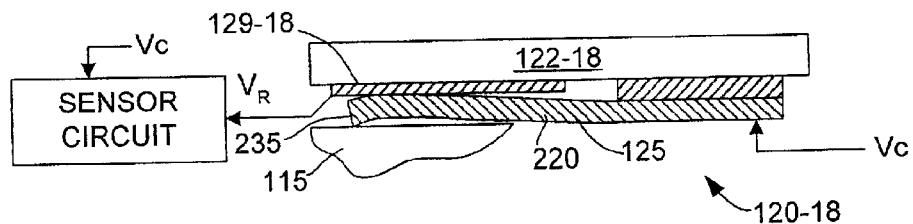

FIGS. 19(A)–19(C) are cross-sectional side views depicting a "passive sensing" operation of spring probe assembly 120-18. Passive sensing operations can be used to obtain information about the current position of spring probe 125 when it is pressed against surface 116 of sample 115. The force applied by sample 115 forces spring probe 125 to roll out on substrate 122-18, as indicated by the sequence shown in FIGS. 19(A), 19(B), and 19(C). By applying a voltage $V_C$ to spring probe 125, the current position of tip 235 can be measured using, for example, an ammeter (sensor circuit) 170-19 by comparing $V_C$ with a current $V_R$ measured from position sensing electrode 129-18. In particular, the amount of measured current increases as spring probe 125 rolls out (i.e., probe tip 235 moves closer to substrate 122-18). When utilized in a scanning probe system (as shown in FIG. 1), this passive sensing scheme allows the detection of high topography steps (e.g. 10–200 microns, compared to maximum of approximately 5 microns with conventional SPM systems). Furthermore, because spring probe deflection is not measured using the optical lever method (described above), non-transparent materials can be used to form substrate 122-18. In one embodiment in which spring probe 125 is formed using MoCr, the surface of spring probe 125 facing position sensing electrode 129-18 is coated with another metal (e.g., Au, which is deposited just before the MoCr deposition) to lower the contact resistance between spring probe 125 and position sensing electrode 129-18.

Referring again to FIG. 18(A), in another embodiment both position sensing electrode 129-18 and an offset actuating electrode structure (e.g., electrode portions 127-10A and 127-10B, described above) are formed on substrate 122-18, thereby facilitating "ON/OFF" sensor operations. Different materials can be used for the actuator and position sensing electrodes, allowing optimization of the design of both electrodes separately. To deploy spring probe 125, voltage to actuating electrode portions 127-10A and 127-10B is turned off, thereby causing spring probe 125 to bend away from substrate 122-18 due to its internal stress gradient, thereby facilitating the "passive sensing" operations depicted in FIGS. 19(A)–19(C). Conversely, when it is desirable to retract spring probe 125 (e.g., in the probe array arrangements, described below), a suitable voltage is applied to actuating electrode portions 127-10A and 127-10B, thereby causing spring probe 125 to roll up.

In addition to the single position sensing electrode arrangement described above, two or more position sensing electrodes may be utilized to provide further resistive position sensing functionality. Examples of such multi-electrode arrangements are described below with reference to FIGS. 20–22.

Figure 20:
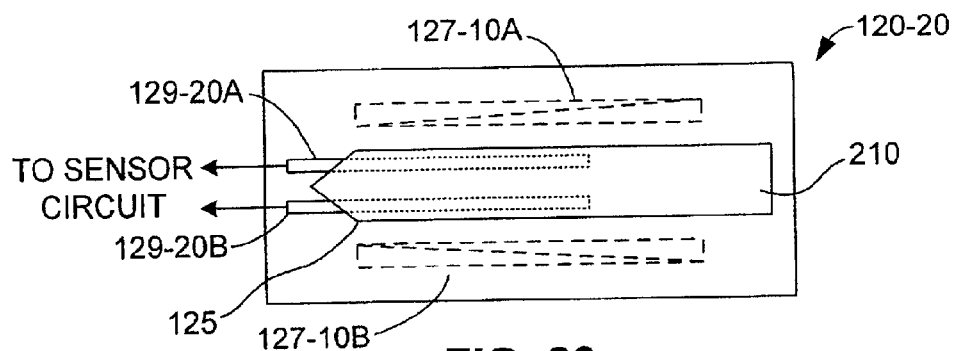
FIG. 20 is a top view showing a probe assembly incorporating position sensing electrodes according to another specific embodiment of the present invention.

FIG. 20 is a top view showing a probe assembly incorporating double rectangular position sensing electrode portions 129-20A and 129-20B according to another specific embodiment of the present invention. As described above, the single position sensing electrode arrangement requires that the spring probe and electrode have different sheet resistances in order to obtain a useful signal. This requirement is not posed in the double electrode arrangement shown in FIG. 20, because only the bottom of spring probe 125 needs to be conducting (for instance, by providing a thin Au metal coating) to create a movable Ohmic contact between position sensing electrodes 129-20A and 129-20B. In another embodiment (not shown), instead of the simple rectangular shapes, dual position sensing electrodes can be formed using a meander-like geometry to maximize the signal range.

Figure 21:
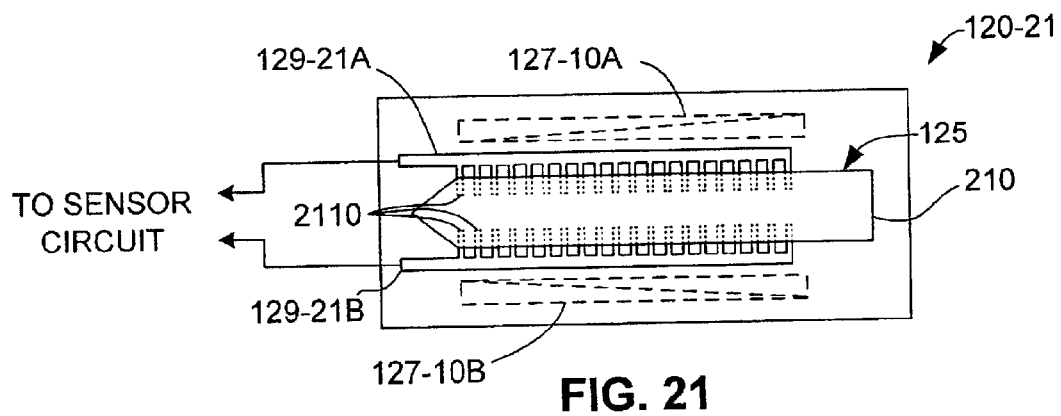
FIG. 21 is a top view showing a probe assembly incorporating position sensing electrodes according to another specific embodiment of the present invention.

FIG. 21 is a top view showing a probe assembly incorporating position sensing electrode portions 129-21A and 129-21B according to another specific embodiment of the present invention. Unlike the double rectangular electrode arrangement shown in FIG. 20, electrode portions 129-21A and 129-21B are comb-shaped, and include multiple tines 2110 that extend under spring probe 125 such that spring probe 125 contacts one or more tines 2110 when spring probe 125 is deflected against the substrate. This comb-shaped electrode arrangement facilitates analog encoding (discrete resistance levels), which is useful, for example, in applications where threshold detection is of interest.

Figure 22:
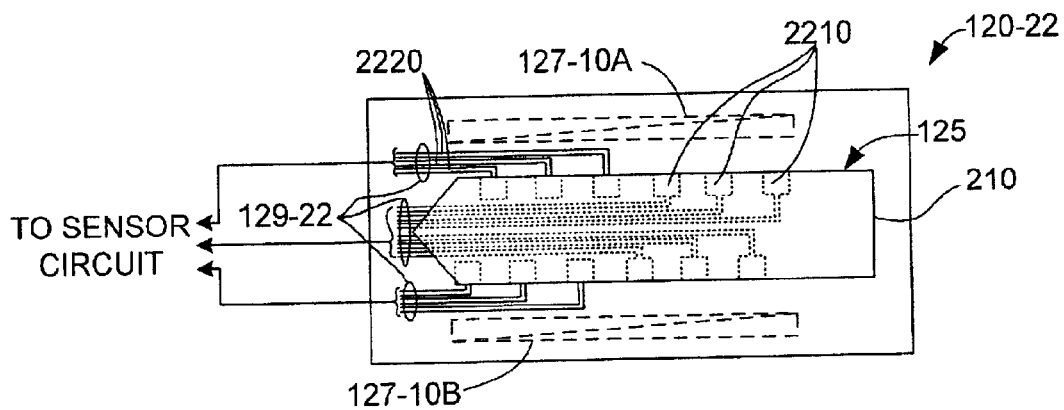
FIG. 22 is a top view showing a probe assembly incorporating position sensing electrodes according to another specific embodiment of the present invention.

FIG. 22 is a top view showing a probe assembly incorporating multiple position sensing electrodes 129-22 according to another specific embodiment of the present invention. Each position sensing electrodes 129-22 includes a contact pad 2210 and an associated conductive trace 2220 formed on the substrate. Contact pads 2210 are spaced apart in a staggered arrangement and positioned under the edges of spring probe 125 such that spring probe 125 contacts one or more contact pads 2210 when spring probe 125 is deflected against the substrate. This multiple electrode configuration facilitates digital encoding of the spring probe position; in this case, only simple on-off behavior between contact pads 1810 and spring probe 125 needs to be detected.

Although the present invention is disclosed with particular reference to scanning probe systems utilizing resistive and "optical lever" laser-based measurement methods, other measurement (detection) schemes (e.g., capacitive, piezoresistive, magnetic, optical, and thermal detection) can be used as well. Note that resistive position sensing method described above is preferred over capacitive detection (which would require the addition of a dielectric layer), as the capacitance of a non-actuated cantilever is typically is below 100 fF (for a fully actuated cantilever with 50 nm electrode spacing it is about 1 pF), which would mean all needed signal processing circuitry has to be integrated on-chip to avoid parasitics. However, for the position sensing electrode designs described above, the impedance of the resistance and capacitance decrease together as the spring probe deflects, suggesting that improved sensitivity is possible if AC measurements are used. Such measurements have the potential to be more robust with time than a metal/metal contact as a hard passivation layer could be used to protect the interface.

Figure 23:
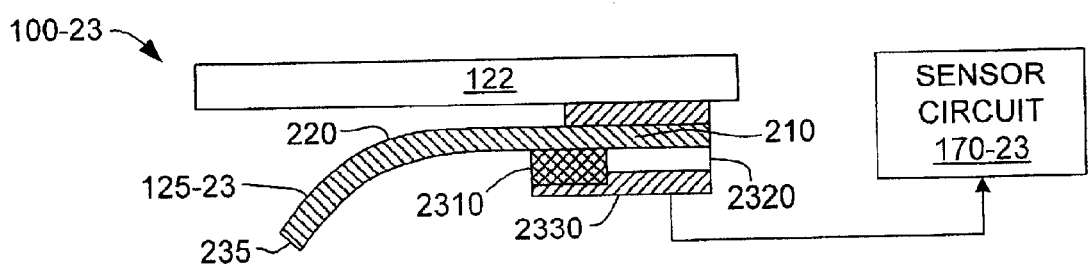
FIG. 23 is a side view showing a spring probe system including piezoresistive sensor system according to yet another embodiment of the present invention.

FIG. 23 shows a portion of a scanning probe system 100-23 including a piezoresistive position sensing arrangement according to yet another embodiment of the present invention. Scanning probe system 100-23 includes a probe assembly 120-23 including a spring probe 125-23 in which a piezoresistive element 2310 is formed over a portion of cantilever section 220, and is connected to a sensor circuit 170-23 via an electrode 2330, which is formed on insulating material portion 2320. During operation, piezoresistor element 2310 change resistance when the stress applied to piezoresistor element 2310 changes (i.e., when spring probe 125-23 is deflected due to force applied to tip 235). In one embodiment, silicon (Si) is deposited on (e.g., metal) spring probe 125-23 after release to form piezoresistive element 2310. Alternatively, a piezoelectric material can be used in place of the piezoresistive material. Similar to the resistive position sensing arrangements described above, the advantage of piezo-based position sensors over laser-based measurement system 140 (also described above) is that they do not need optical alignment, and also have large dynamic ranges.

The various embodiments described above facilitate the formation of inexpensive probe arrays that can significantly reduce the operating expense and down time associated with conventional scanning probe systems. As discussed above, probe tips periodically wear out, requiring system down time to replace the probe. Unlike conventional probes, multiple spring probes of the type described herein can be inexpensively fabricated on a single substrate to form the spring probe arrays, described below, in which a selected spring probe is deployed while retracting the remaining spring probes of the array, and then retracting the selected spring probe when its tip becomes blunt (i.e., wears out). An exemplary array is described below with reference to FIGS. 24, 25(A) and 25(B).

Figure 24:
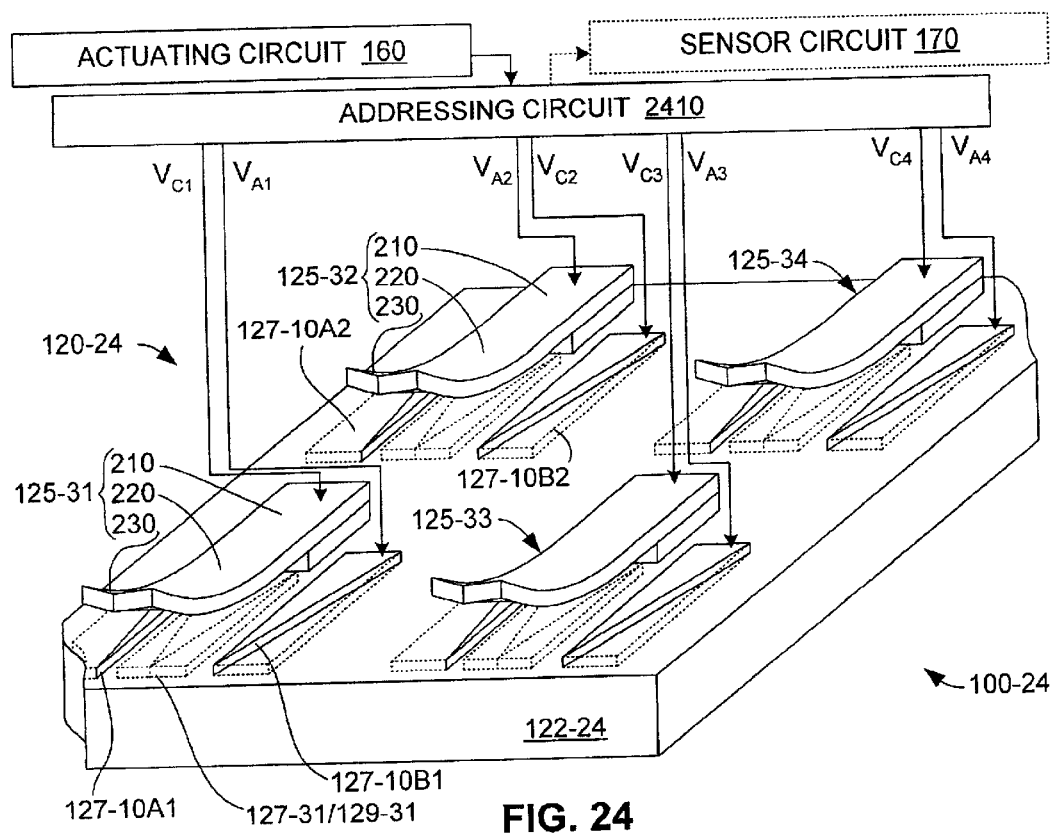
FIG. 24 is a simplified perspective view showing a spring assembly including an array of spring probes according to another aspect of the present invention.

FIG. 24 is a perspective view showing a portion of a scanning probe system 100-24 including a spring probe array 120-24 according to yet another embodiment of the present invention. Spring probe array 120-24 includes multiple spring probes 125-31 through 125-34 that are arranged in a one- or two-dimensional array on a single substrate 122-24. Similar to the embodiments described above, each spring probe 125-31 through 125-34 includes a fixed end 210 attached to substrate 122-24, a central section 220 bending away from substrate 122-24, and a free end 230 including a probe tip 235. Further, each spring probe 125-31 through 125-34 is fabricated as described above to include an internal stress gradient in a direction normal to substrate 122-24.

Spring probe array 120-24 further includes multiple actuation electrodes and/or sensing electrodes that are individually accessible through an addressing circuit 2410 according to known techniques to facilitate "ON/OFF" array operations. As shown in FIG. 24, spring probe array 120-24 includes multiple offset actuation electrode portions located adjacent to associated spring probes 125-31 through 125-34. For example, actuation electrode portions 127-10A1 and 127-10B1 are located on opposite sides of spring probe 125-31. Similarly, actuation electrode portions 127-10A2 and 127-10B2 are located on opposite sides of spring probe 125-32. Each of these actuation electrode portion operates as described above with reference to FIGS. 10(A) through 10(C).

Figure 25A:
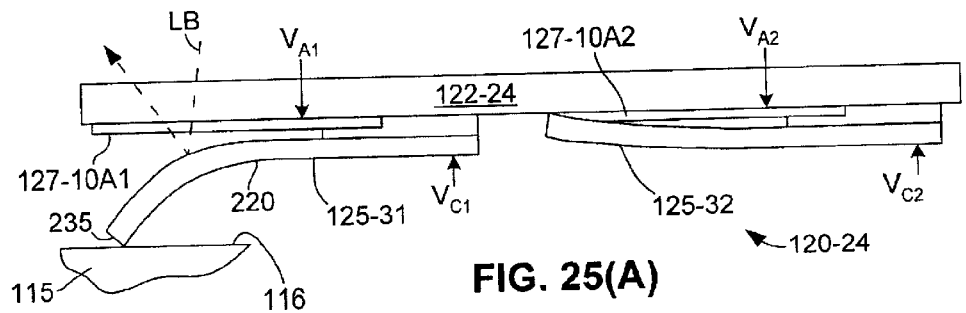
FIGS. 25(A) and 25(B) are side views showing the operation of the spring probe array of FIG. 24.
Figure 25B:
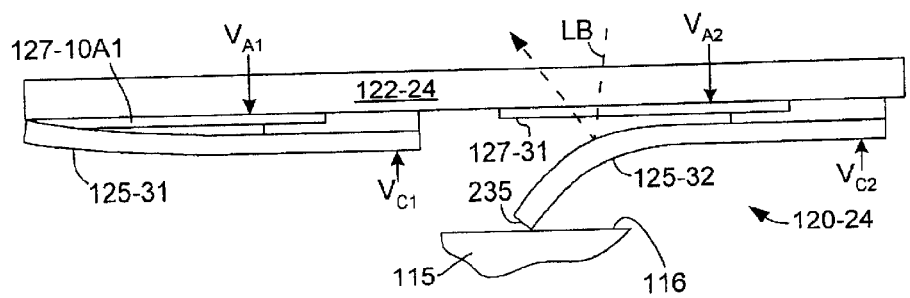

During operation of array 120-24, actuation voltages are routed through addressing circuit 2410 and applied to non-selected spring probes to pull (snap) these spring probes against substrate 122-24, thereby leaving a selected spring probe deployed for scanning operations. For example, referring to FIG. 25(A), voltages $V_{A1}$ and $V_{C1}$ are de-asserted (e.g., zero Volts), thereby causing spring probe 125-31 to deploy for scanning operations on surface 116 of sample 115. At the same time, voltages $V_{A2}$ and $V_{C2}$ are asserted, thereby pulling spring probe 125-32 against substrate 122-24 (i.e., away from surface 116 of sample 115). Subsequently, as shown in FIG. 25(B), when it is determined that tip 235 of spring probe 125-31 is undesirably blunted by contact with sample 115, voltages $V_{A1}$ and $V_{C1}$ are asserted to pull spring probe 125-31 against substrate 122-24, and voltages $V_{A2}$ and $V_{C2}$ are de-asserted to deploy for scanning operations on surface 116 of sample 115. In this manner, spring probe array 120-24 greatly reduces operating down time (and associated expense) of scanning probe system 100-24 by allowing an operator to selectively switch between the various spring probes 125-31 through 125-34 of array 120-24.

The spring probe technology utilized to form spring probes 125-31 through 125-34 offers several advantages over existing scanning probe technologies. The main disadvantage of other conventional probes is that it is very difficult to move the conventional probes toward and away from the holder chip. In contrast, a relatively small amount of force is required to actuate (deploy or retract) the spring probes utilized in array 120-24. Further, arrays of spring probes can be packed relatively densely together and fabricated in a single lithographic process, while conventional probes require more fabrication steps. Further, most conventional probe technologies do not allow for the use of transparent substrates, and therefore the probe tips cannot be seen while scanning, or openings have to be etched through the substrates. In contrast, as indicated in FIGS. 25(A) and 25(B), the formation of spring probes 125-31 and 125-32 on transparent substrate 122-24 facilitates both observation and the use of optical-lever measurement techniques (as described above). Further, probe array 120-24 can be mounted in a conventional scanning probe system with minimal modification (e.g., providing addressing circuit 2410).

Although spring probe array 120-24 is described with reference to "ON/OFF" sensor operations, other spring probe structures described herein may be utilized to form arrays that fall within the scope of the present invention. For example, instead of offset actuation electrodes 127-10A1 and 127-10B1, spring probe 125-31 can be actuated using a rectangular or tapered under-probe actuation electrode 127-31. Alternatively, in combination with the actuation electrodes, a feedback loop can be used in order to maintain the selected spring probe at a desired height/force (e.g., using electrostatic actuation). Further, one or more of the position sensing arrangements described herein may be utilized to determine the position of each spring probe of the array. For example, the deflected position of spring probe 125-31 can be measured using a rectangular or tapered under-probe position sensing electrode 129-31. Moreover, in addition to topography measurements, spring probe arrays can be utilized to perform electrical and thermal measurements.

Figure 26:
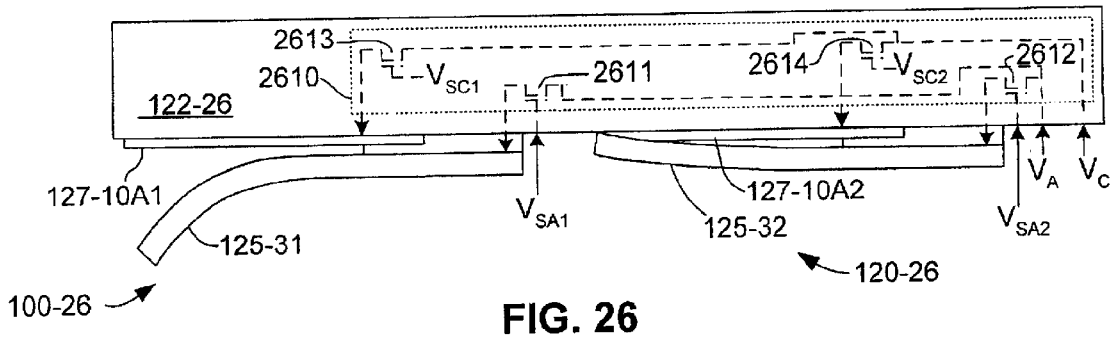
FIG. 26 is a simplified side view showing a spring probe system including an integrated actuation circuit according to yet another embodiment of the present invention.

FIG. 26 is a simplified side view showing a portion of scanning probe system 100-26 including a spring probe array 120-26 according to another embodiment of the present invention. Spring probe array 120-26 includes spring probes 125-31 and 125-32 and associated actuating/position sensing circuitry, as described above. However, unlike the embodiment shown in FIG. 4, which includes an external addressing circuit, spring probe array 120-26 includes an on-chip (integrated) addressing circuit 2610. As discussed above, an advantage of the spring probes associated with the present invention is that they can be formed, for example, on semiconductor (e.g., silicon) substrates using conventional lithographic techniques, thereby facilitating the formation of control circuitry under the spring probes. As shown in FIG. 26, addressing circuit 2610 includes four (e.g., CMOS) transistors 2611 through 2614 that are controlled by associated control voltages $V_{SA1}$, $V_{SA2}$, $V_{SC1}$, and $V_{SC2}$, respectively, to pass control voltages $V_A$ and $V_C$ to selected actuation electrodes and spring probes. In addition to addressing circuit 2610, other operating circuitry of scanning probe system 100-26 (e.g., circuitry utilized to control the actuating electrodes) can be similarly integrated onto substrate 122-26 under the spring probes.

Figure 27:
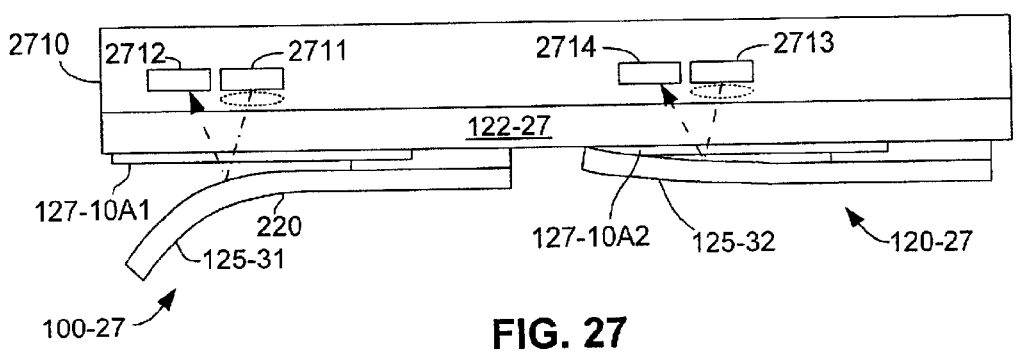
FIG. 27 is a simplified side view showing a spring probe system including a photodiode/photosensor array according to yet another embodiment of the present invention.

FIG. 27 is a simplified side view showing a portion of scanning probe system 100-27 including a spring probe array 120-27 according to another yet embodiment of the present invention. Spring probe array 120-27 includes spring probes 125-31 and 125-32 and associated actuating/position sensing circuitry, as described above. In addition, spring probe array 120-27 includes a laser/detector array 2710 that is mounted on transparent substrate 122-27. As discussed above, another advantage of the spring probes associated with the present invention is that they can be formed on transparent substrates, thereby facilitating optical-lever measurement techniques in which a laser (or other light beam) is directed through the substrate. As shown in FIG. 27, instead of having to re-direct a single laser to a selected spring probe, a parallel optical-lever measurement system can be provided in which each spring probe is measured by its own laser/detector pair. In particular, laser/detector array 2710 includes several pairs of light sources (e.g., laser diodes) and light detectors (e.g., photodiodes) that are positioned to measure the deflected position of associated spring probes 125-31 and 125-32. For example, light source 2711 and one or more light detectors 2712 are positioned over spring probe 125-31 such that a light beam emitted by light source 2711 is directed (e.g., by an optional lens structure, indicated in dashed lines) through substrate 122-27 to strike spring probe 125-31. The light reflected from probe 125-31 is directed to light detector 2712, and is utilized to determine the position of spring probe 125-31 similar to the manner described above. Similarly, light source 2713 and light detector 2714 are positioned over spring probe 125-32 such that a light beam emitted by light source 2713 is reflected from spring probe 125-32 and captured by light detector 2714.

Figure 28A:
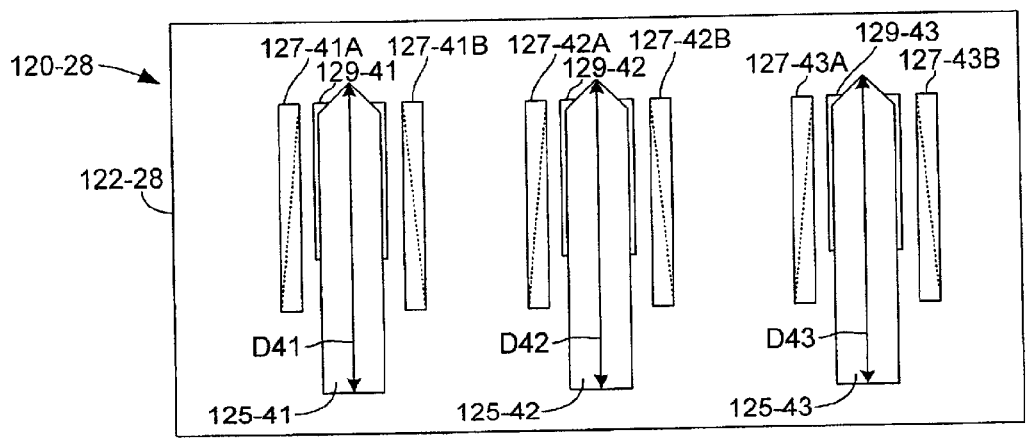
FIGS. 28(A) and 28(B) are plan and simplified side views, respectively, showing a spring probe system including multiple parallel spring probes according to yet another embodiment of the present invention.
Figure 28B:
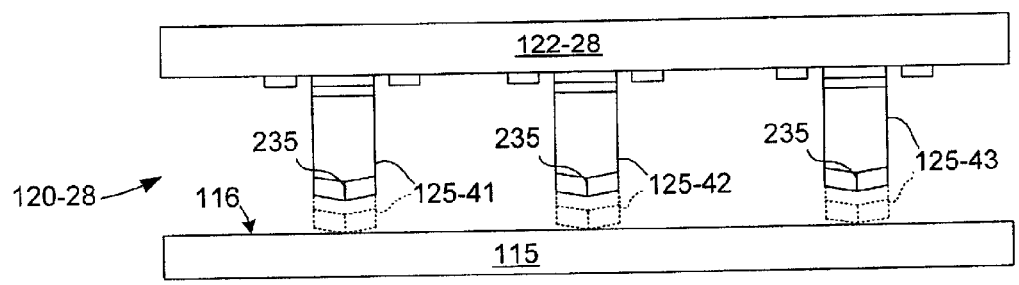

FIGS. 28(A) and 28(B) are plan and side views showing a portion of scanning probe system 100-28 including a spring probe array 120-28 according to another yet embodiment of the present invention. Spring probe array 120-28 includes spring probes 125-41 through 125-43 that are arranged in parallel (i.e., longitudinal lengths D41, D42, and D43 are aligned in parallel directions) and positioned such that probe tips 235 simultaneously contact several points of surface 116, thereby facilitating wide-area scanning of sample 115. As discussed above, another advantage of the present invention is that the spring probes can be independently actuated using a relatively small amount of power, can be spaced closer together than conventional probes, and can be formed with longer in-plane tip structures than is possible using conventional out-of-plane probe tip structures. Accordingly, spring probe array 120-28 facilitates having spring probes 125-41, 125-42, and 125-43 simultaneously interacting with sample 115 by driving the associated actuation circuitry in tapping mode (indicated by dashed lines) or constant force imaging mode operations, and sensing the contact position of each spring probe (e.g., using the resistive, piezoresistive, or capacitive position measuring techniques described above). The ability to form spring probes with tall tips is especially useful in such arrays because it facilitates alignment to a flat sample surface. This arrangement also facilitates scanning larger sample areas at the same time, or for the same area to be scanned in a shorter time.

Figure 29:
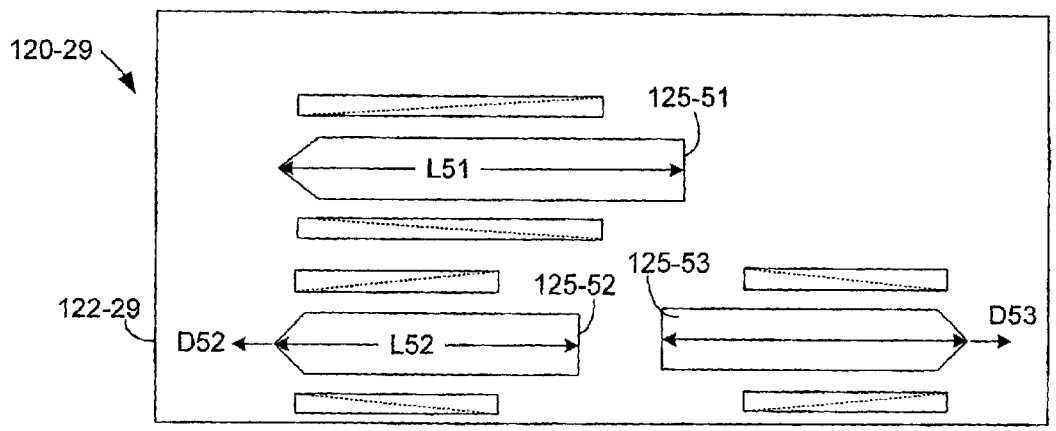
FIG. 29 is a plan view showing a spring probe system including multiple spring probes having different lengths and orientations according to yet another embodiment of the present invention.
Figure 30:
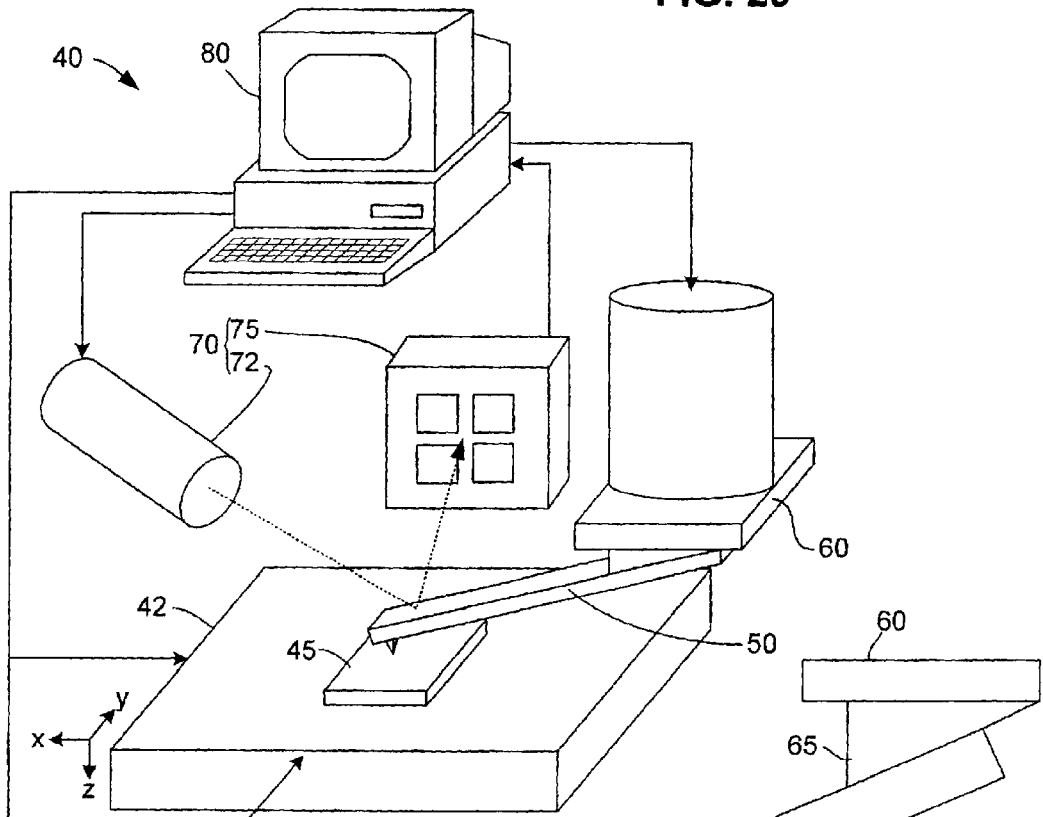
FIG. 30 is a perspective view showing a conventional scanning probe microscope system.
Figure 31:
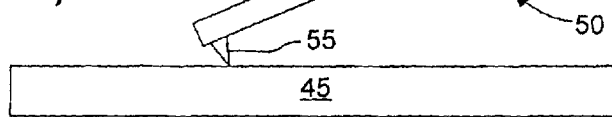
FIG. 31 is a simplified side view showing a conventional probe using the scanning probe microscope system of FIG. 30.

FIG. 29 is a plan view showing a portion of spring probe array 120-29 according to another yet embodiment of the present invention. Spring probe array 120-29 includes spring probes 125-51 through 125-53 (and associated actuating circuitry) that have different lengths and different orientations. By providing spring probes with different lengths, a single spring probe array can be utilized to perform several types of scanning operations. For example, spring probe 125-51 has a longitudinal length L51 that is longer than a longitudinal length of spring probe 125-52. Accordingly, longer spring probe 125-51 may be deployed to perform deep side wall probing, whereas shorter spring probe 125-52 may be utilized to perform high-speed tapping mode operations. Further, note that the longitudinal axis of spring probe 125-52 is aligned in a direction D2 that is different (e.g., opposite) to the longitudinal axis D3 of spring probe 125-53. This arrangement allows, for example, probing of both sides of a side wall.

Although the present invention has been described with respect to certain specific embodiments, it will be clear to those skilled in the art that the inventive features of the present invention are applicable to other embodiments as well, all of which are intended to fall within the scope of the present invention. For example, In addition to the spring probes utilizing in-plane tips described above, nearly every existing out-of-plane tip (e.g., Si, SiOx, SiNx, diamond, or metal) can be integrated on the tip of the spring probes disclosed herein. That is, although in-plane tips provide several advantages over out-of-plane tips, in some instances the characteristics of an out-of-plane tip may be beneficial. Further, note that resistors in general can be used as spring probe actuators. When resistors are heated, they change the temperature of the spring probe, which induces a deflection. This deflection is strongest when the spring probe consists of multiple layers with different thermal expansion coefficients (bimorph effect). Moreover, in linear spring probe arrays, the unused spring probes may also be pulled against the substrate (i.e., retracted) using mechanical actuation.

What is claimed is:

1. A scanning probe system for probing a sample, the scanning probe system comprising:
 a probe assembly including a substrate and a first spring probe having a fixed end attached to the substrate, a central section bending away from the substrate, and a free end including a probe tip; and
 means for actuating the cantilever section of the first spring probe such that the probe tip is displaceable relative to the substrate.

2. The scanning probe system according to claim 1, further comprising:
   a stage for supporting the sample;
   a holder plate for supporting the probe assembly over the stage;
   a computer/workstation for controlling one of the stage and the holder plate to cause relative movement between the stage and the probe assembly in the plane such that the probe tip scans along the surface of the sample.

3. The scanning probe system according to claim 1, further comprising a measurement device including:
   a laser for generating a laser beam that is directed to strike a selected section of the spring probe; and
   a photosensor array positioned to receive portions of the laser beam reflected from the selected section of the spring probe.

4. The scanning probe system according to claim 3,
   wherein the substrate of the probe assembly is transparent, and
   wherein laser is positioned such that the laser beam is directed from the laser to the selected section of the spring probe through the transparent substrate, and
   wherein the photosensor array is positioned such that the portions of the laser beam reflected from the selected section of the spring probe pass through the transparent substrate.

5. The scanning probe system according to claim 4, wherein the transparent substrate is selected from the group including glass, quartz, and plastic.

6. The scanning probe system according to claim 1, wherein the spring probe comprises one or more selected from molybdenum (Mo), tungsten (W), titanium (Ti), chromium (Cr), nickel (Ni), silicon (Si), silicon oxide (SiOx), silicon nitride (SiNx), carbide, and diamond.

7. The scanning probe system according to claim 1, wherein the free end of the spring probe is shaped to form a sharp point, and the probe tip is formed by the sharp point.

8. The scanning probe system according to claim 1, further comprising a support portion located between the fixed end of the spring probe and the substrate.

9. The scanning probe system according to claim 8, wherein the support portion comprises one or more of amorphous-silicon (a-Si), silicon-nitride (SiNx), silicon-oxide (SiOx), and titanium (Ti).

10. The scanning probe system according to claim 1, wherein said actuating means comprises:
    a first actuation electrode formed on the substrate adjacent to the central section of the first spring probe; and
    a signal source connected to the first spring probe and to the first actuation electrode.

11. The scanning probe system according to claim 10, wherein the first actuation electrode comprises a first and second elongated electrode portions extending parallel to and offset from the first spring probe such that the first spring probe is located between the first and second elongated portions.

12. The scanning probe system according to claim 11, wherein each of the first and second elongated electrode includes a relatively wide portion located adjacent to the fixed end of the first spring probe, and a relatively narrow portion located adjacent to the probe tip of the first spring probe.

13. The scanning probe system according to claim 11, wherein each of the first and second elongated electrode portions has a substantially rectangular shape.

14. The scanning probe system according to claim 10, wherein the first actuation electrode includes a portion located between the substrate and at least one of the central section and the free end of the first spring probe.

15. The scanning probe system according to claim 14, wherein the electrode portion has a substantially rectangular shape.

16. The scanning probe system according to claim 14, wherein the first actuation electrode further comprises first and second elongated electrode portions extending parallel to the first spring probe and positioned such that the first spring probe is located between the first and second elongated portions.

17. The scanning probe system according to claim 14, wherein the electrode portion includes a relatively wide portion located adjacent to the fixed end of the first spring probe, and a relatively narrow portion located adjacent to the probe tip of the first spring probe.

18. The scanning probe system according to claim 17, wherein the probe defines a tapered opening located over the electrode portion.

19. The scanning probe system according to claim 10, wherein the first spring probe is mounted on a first surface of the substrate, and wherein the first actuation electrode is mounted on a second surface of the substrate.

20. The scanning probe system according to claim 1,
    wherein the scanning probe system further comprises a holder plate for supporting the probe assembly, and
    wherein said actuating means comprises:
      an actuation electrode formed on the holder plate; and
      a signal source connected to the first spring probe and to the actuation electrode.

21. The scanning probe system according to claim 20, wherein the actuation electrode is located between the holder plate and the substrate of the probe assembly.

22. The scanning probe system according to claim 1,
    wherein said spring probe comprises a magnetic material, and
    wherein said actuating means comprises:
      a current source; and
      a coil for generating a magnetic field in response to a current generated by the current source, the coil being located adjacent to the spring probe such that the spring probe is actuated in response to the magnetic field.

23. The scanning probe system according to claim 22,
    wherein the scanning probe system further comprises a stage for supporting the sample, and
    wherein the coil is positioned such that the stage is located between the coil and the spring probe.

24. The scanning probe system according to claim 22, wherein the spring probe comprises nickel (Ni).

25. The scanning probe system according to claim 22, wherein a coating of magnetic material is formed on the spring probe.

26. The scanning probe system according to claim 1, wherein the actuating means comprises an acoustic transducer positioned adjacent to the first spring probe.

27. The scanning probe system according to claim 1,
    wherein said probe assembly further comprises a piezoelectric actuation element formed over a portion of the central section, and
    wherein said actuating means comprises a voltage source for applying an actuation voltage to the piezoelectric actuation element.

28. The scanning probe system according to claim 1, further comprising means for sensing the position of the first spring probe relative to the substrate.

29. The scanning probe system according to claim 28, wherein said position sensing means comprises:
a position sensing electrode formed on the substrate and positioned opposite the first spring probe such that the cantilever section contacts the position sensing electrode when the first spring probe is deflected toward the substrate; and
a sensing circuit for sensing a current generated in the position sensing electrode.

30. The scanning probe system according to claim 29, wherein the position sensing electrode has a rectangular shape.

31. The scanning probe system according to claim 29, wherein the position sensing electrode comprises first and second rectangular electrode portions extending under the spring probe.

32. The scanning probe system according to claim 29, wherein the position sensing electrode comprises first and second comb-shaped electrode portions having tines extending under the spring probe.

33. The scanning probe system according to claim 29, wherein the position sensing electrode comprises a plurality of spaced apart pads positioned under the spring probe, each pad being connected to a separate conductive trace formed on the substrate.

34. The scanning probe system according to claim 28, wherein said probe assembly further comprises a piezoresistive element formed over a portion of the central section, and
wherein said position sensing means comprises a sensor circuit for sensing a voltage passing through the piezoresistive element.

35. The scanning probe system according to claim 10, wherein the probe assembly further comprises a second spring probe located adjacent to the first spring probe, the second spring probe having a fixed end attached to the substrate, a central section bending away from the substrate, and a free end including a probe tip, the second spring probe also having an internal stress gradient in a direction normal to the substrate, and
wherein the scanning probe system further comprises:
a second actuation electrode formed on the substrate adjacent to the central section of the second spring probe.

36. The scanning probe system according to claim 35, wherein the first actuation electrode comprises first and second elongated electrode portions extending parallel to and offset from the first spring probe such that the first spring probe is located between the first and second elongated portions, and
wherein the second actuation electrode comprises third and fourth elongated electrode portions extending parallel to and offset from the second spring probe such that the second spring probe is located between the third and fourth elongated portions.

37. The scanning probe system according to claim 36, wherein each of the first, second, third, and fourth elongated electrode portions includes a relatively wide portion located adjacent to the fixed end of the first spring probe, and a relatively narrow portion located adjacent to the probe tip of the first spring probe.

38. The scanning probe system according to claim 37, wherein each of the first, second, third, and fourth elongated electrode portions has a substantially rectangular shape.

39. The scanning probe system according to claim 35, wherein the first actuation electrode includes a first portion located between the substrate and at least one of the central section and the free end of the first spring probe, and
wherein the second actuation electrode includes a second portion located between the substrate and at least one of the central section and the free end of the second spring probe.

40. The scanning probe system according to claim 39, wherein each of the first and second electrode portions has a substantially rectangular shape.

41. The scanning probe system according to claim 39,
wherein the first actuation electrode further comprises first and second elongated electrode portions extending parallel to and offset from the first spring probe such that the first spring probe is located between the first and second elongated portions, and
wherein the second actuation electrode further comprises third and fourth elongated electrode portions extending parallel to and offset from the second spring probe such that the second spring probe is located between the third and fourth elongated portions.

42. The scanning probe system according to claim 39,
wherein the first electrode portion includes a relatively wide portion located adjacent to the fixed end of the first spring probe, and a relatively narrow portion located adjacent to the probe tip of the first spring probe, and
wherein the second electrode portion includes a relatively wide portion located adjacent to the fixed end of the second spring probe, and a relatively narrow portion located adjacent to the probe tip of the second spring probe.

43. The scanning probe system according to claim 35, further comprising means for sensing the position of the probe tips of the first and second spring probes relative to the substrate.

44. The scanning probe system according to claim 35, wherein said position sensing means comprises:
a first position sensing electrode formed on the substrate and positioned opposite the first spring probe such that the cantilever section of the first spring probe contacts the first position sensing electrode when the first spring probe is deflected toward the substrate;
a second position sensing electrode formed on the substrate and positioned opposite the second spring probe such that the cantilever section of the second spring probe contacts the second position sensing electrode when the second spring probe is deflected toward the substrate; and
a sensing circuit for sensing currents generated in the first and second position sensing electrodes.

45. The scanning probe system according to claim 35, further comprising addressing means for transmitting actuating voltages to a selected one of the first actuation electrode and the second actuation electrode.

46. The scanning probe system according to claim 45, wherein the addressing means comprises a plurality of transistors fabricated on the substrate below the first and second spring probes.

47. The scanning probe system according to claim 35, further comprising a measurement system including a plurality of light sources and a plurality of light detectors, wherein a first light source of the measurement system is located adjacent to an associated first light detector, and is positioned to direct a light beam through the substrate to strike the first spring probe.

48. The scanning probe system according to claim 35, wherein the first spring probe is arranged parallel to the second spring probe.

49. The scanning probe system according to claim 35, wherein the first spring probe defines a first length that is longer than a second length defined by the second spring probe.

50. The scanning probe system according to claim 35, wherein the first spring probe is aligned in a first direction and the second spring probe is aligned in a second direction that is different from the first direction.

51. A scanning probe system for probing a sample, the scanning probe system comprising:
   a probe assembly including a substrate and a spring probe having a fixed end attached to the substrate, a central section bending away from the substrate, and a free end including a probe tip; and
   means for sensing a deflected position of the spring probe relative to the substrate.

52. The scanning probe system according to claim 51, further comprising:
   a stage for supporting the sample;
   a holder plate for supporting the probe assembly over the stage;
   a computer/workstation for controlling one of the stage and the holder plate to cause relative movement between the stage and the probe assembly in the plane such that the probe tip scans along the surface of the sample.

53. The scanning probe system according to claim 51, wherein the spring probe comprises one or more selected from molybdenum (Mo), tungsten (W), titanium (Ti), chromium (Cr), nickel (Ni), silicon (Si), silicon oxide (SiOx), silicon nitride (SiNx), carbide, and diamond.

54. The scanning probe system according to claim 51, wherein the free end of the spring probe is shaped to form a sharp point, and the probe tip is formed by the sharp point.

55. The scanning probe system according to claim 51, further comprising a support portion located between the fixed end of the spring probe and the substrate.

56. The scanning probe system according to claim 51, wherein the support portion comprises one or more of amorphous-silicon (a-Si), silicon-nitride (SiNx), silicon-oxide (SiOx), and titanium (Ti).

57. The scanning probe system according to claim 51, wherein said position sensing means comprises:
   a position sensing electrode formed on the substrate and positioned opposite the spring probe such that the cantilever section contacts the position sensing electrode when the spring probe is deflected toward the substrate; and
   a sensing circuit for sensing a current generated in the position sensing electrode.

58. The scanning probe system according to claim 57, wherein the position sensing electrode has a rectangular shape.

59. The scanning probe system according to claim 57, wherein the position sensing electrode comprises first and second rectangular electrode portions extending under the spring probe.

60. The scanning probe system according to claim 57, wherein the position sensing electrode comprises first and second comb-shaped electrode portions having tines extending under the spring probe.

61. The scanning probe system according to claim 57, wherein the position sensing electrode comprises a plurality of spaced apart pads positioned under the spring probe, each pad being connected to a separate conductive trace formed on the substrate.

62. The scanning probe system according to claim 51,
   wherein said probe assembly further comprises a piezoresistive element formed over a portion of the central section, and
   wherein said position sensing means comprises a sensor circuit for sensing a voltage passing through the piezoresistive element.

* * * * *